United States Patent
Chen et al.

(10) Patent No.: US 12,107,104 B2
(45) Date of Patent: Oct. 1, 2024

(54) BACKSIDE REFRACTION LAYER FOR BACKSIDE ILLUMINATED IMAGE SENSOR AND METHODS OF FORMING THE SAME

(71) Applicant: Taiwan Semiconductor Manufacturing Company Limited, Hsinchu (TW)

(72) Inventors: Po-Han Chen, Tainan (TW); Kuo-Cheng Lee, Tainan (TW); Fu-Cheng Chang, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 88 days.

(21) Appl. No.: 17/867,109

(22) Filed: Jul. 18, 2022

(65) Prior Publication Data

US 2022/0352230 A1    Nov. 3, 2022

Related U.S. Application Data

(62) Division of application No. 16/715,318, filed on Dec. 16, 2019, now Pat. No. 11,581,349.

(51) Int. Cl.
  *H01L 27/146*    (2006.01)
(52) U.S. Cl.
  CPC .. *H01L 27/14625* (2013.01); *H01L 27/14621* (2013.01); *H01L 27/14627* (2013.01);
  (Continued)
(58) Field of Classification Search
  CPC ........... H01L 27/1464; H01L 27/14625; H01L 27/14685
  See application file for complete search history.

(56) References Cited

U.S. PATENT DOCUMENTS 9,985,072 B1    5/2018  Wen et al.
2009/0200625 A1   8/2009  Venezia et al.
(Continued)

FOREIGN PATENT DOCUMENTS

DE    102017118989 A1    11/2018
JP    2015220313 A    12/2015
(Continued)

OTHER PUBLICATIONS

Korean Patent and Trademark Office, Application No. 1020200032415, Office Action dated Aug. 29, 2021, 7 pages.
(Continued)

*Primary Examiner* — Kevin Parendo
(74) *Attorney, Agent, or Firm* — The Marbury Law Group, PLLC

(57) ABSTRACT

Photosensors may be formed on a front side of a semiconductor substrate. An optical refraction layer having a first refractive index may be formed on a backside of the semiconductor substrate. A grid structure including openings is formed over the optical refraction layer. A masking material layer is formed over the grid structure and the optical refraction layer. The masking material layer may be anisotropically etched using an anisotropic etch process that collaterally etches a material of the optical refraction layer and forms non-planar distal surface portions including random protrusions on physically exposed portions of the optical refraction layer. An optically transparent layer having a second refractive index that is different from the first refractive index may be formed on the non-planar distal surface portions of the optical refraction layer. A refractive interface refracts incident light in random directions, and improves quantum efficiency of the photo sensors.

20 Claims, 26 Drawing Sheets

(52) U.S. Cl.
CPC .... *H01L 27/14629* (2013.01); *H01L 27/1464* (2013.01); *H01L 27/14645* (2013.01); *H01L 27/14685* (2013.01); *H01L 27/14636* (2013.01)

(56) References Cited

U.S. PATENT DOCUMENTS

| | | |
|---|---|---|
| 2015/0130007 A1 | 5/2015 | Kawamura |
| 2017/0141151 A1 | 5/2017 | Sato |
| 2018/0337211 A1 | 11/2018 | Su et al. |
| 2019/0027518 A1 | 1/2019 | Miyata et al. |
| 2019/0165026 A1 | 5/2019 | Kuo et al. |
| 2019/0319054 A1 | 10/2019 | Han |
| 2020/0027909 A1 | 1/2020 | Ebiko et al. |
| 2021/0134875 A1 | 5/2021 | Lu et al. |
| 2021/0375971 A1 | 12/2021 | Tayanaka |

FOREIGN PATENT DOCUMENTS

| | | |
|---|---|---|
| KR | 20150053707 A | 5/2015 |
| TW | 201034058 A | 9/2010 |
| TW | 201639137 A | 11/2016 |
| TW | 201933599 A | 8/2019 |
| WO | 2015174297 A1 | 11/2015 |
| WO | 2017126329 | 7/2017 |

OTHER PUBLICATIONS

Taiwan Patent and Trademark Office, Application No. 109144319, Notice of Allowance dated Jan. 25, 2022, 4 pages.
Korean Patent and Trademark Office, Application No. 1020200032415, Office Action Dated Feb. 24, 2022, 4 pages.
Korean Patent and Trademark Office, Application No. 1020200032415, Notice of Allowance Dated Apr. 1, 2022, 6 pages.
German Patent and Trademark Office, Application No. 10 2019 135 080.8 Examination Report mailed Feb. 7, 2023, 6 pages.

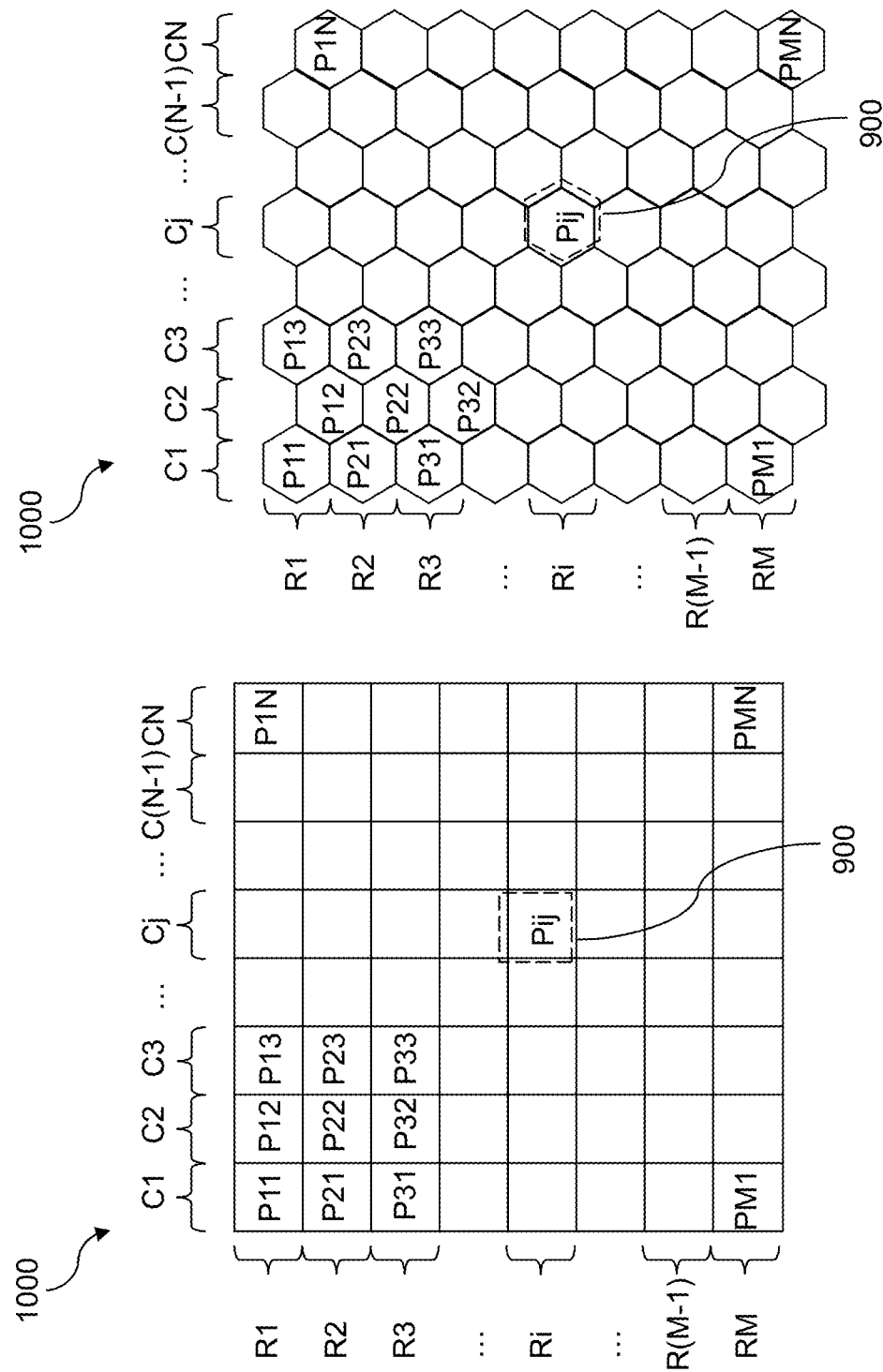

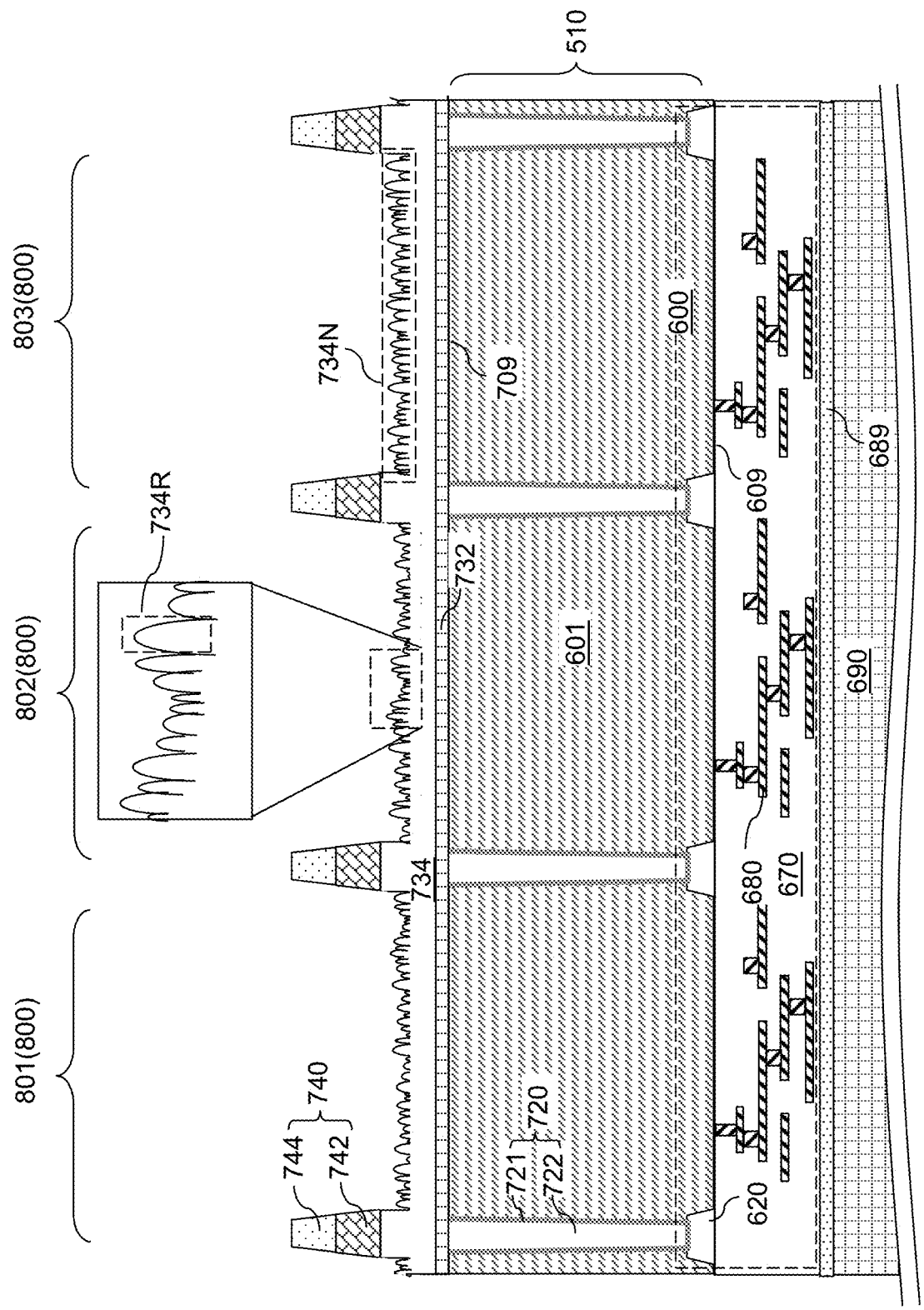

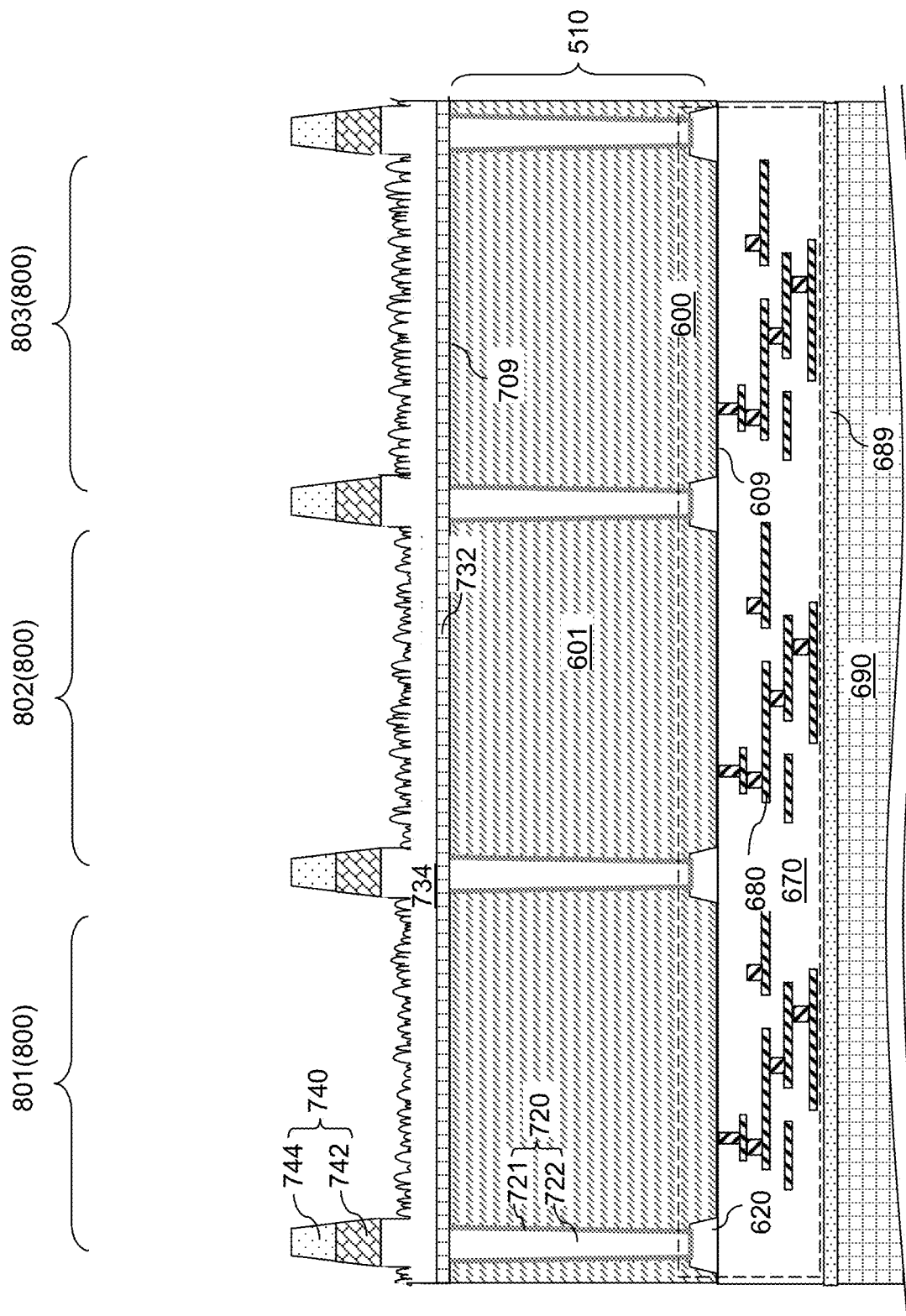

BACKSIDE REFRACTION LAYER FOR BACKSIDE ILLUMINATED IMAGE SENSOR AND METHODS OF FORMING THE SAME

RELATED APPLICATIONS

This application is a divisional application of U.S. application Ser. No. 16/715,318 entitled "Backside Refraction Layer for Backside Illuminated Image Sensor and Methods of Forming the Same," filed on Dec. 16, 2019, the entire contents of which are incorporated herein by reference for all purposes.

BACKGROUND

The present disclosure is directed to semiconductor devices, and specifically to a backside illuminated complementary metal-oxide-semiconductor (CMOS) image sensor and methods of forming the same.

Semiconductor image sensors are used to sense electromagnetic radiation such as visible range light, infrared radiation, and/or ultraviolet light. Complementary metal-oxide-semiconductor (CMOS) image sensors (CIS) and charge-coupled device (CCD) sensors are used in various applications such as digital cameras or embedded cameras in mobile devices. These devices utilize an array of pixels (which may include photodiodes and transistors) to detect radiation using photogeneration of electron-hole pairs. A backside illuminated (BSI) image sensor is an image sensor that is configured to detects light impinging on a backside of a semiconductor substrate. CMOS circuitry for detecting and processing photogenerated signals may be formed on a front side of the semiconductor substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a plan view of a first configuration for an array of pixels of an image sensor according to an embodiment of the present disclosure.

FIG. 1B is a plan view of a second configuration for an array of pixels of an image sensor according to an embodiment of the present disclosure.

FIG. 12A is a vertical cross-sectional view of the exemplary structure after formation of non-planar distal surface portions on the optical refraction layer by anisotropically etching the masking material layer and collaterally etching top portions of the optical refraction layer according to an embodiment of the present disclosure.

FIG. 13A is a vertical cross-sectional view of the exemplary structure after removal of the patterned photoresist layer according to an embodiment of the present disclosure.

DETAILED DESCRIPTION

Figure 2A:
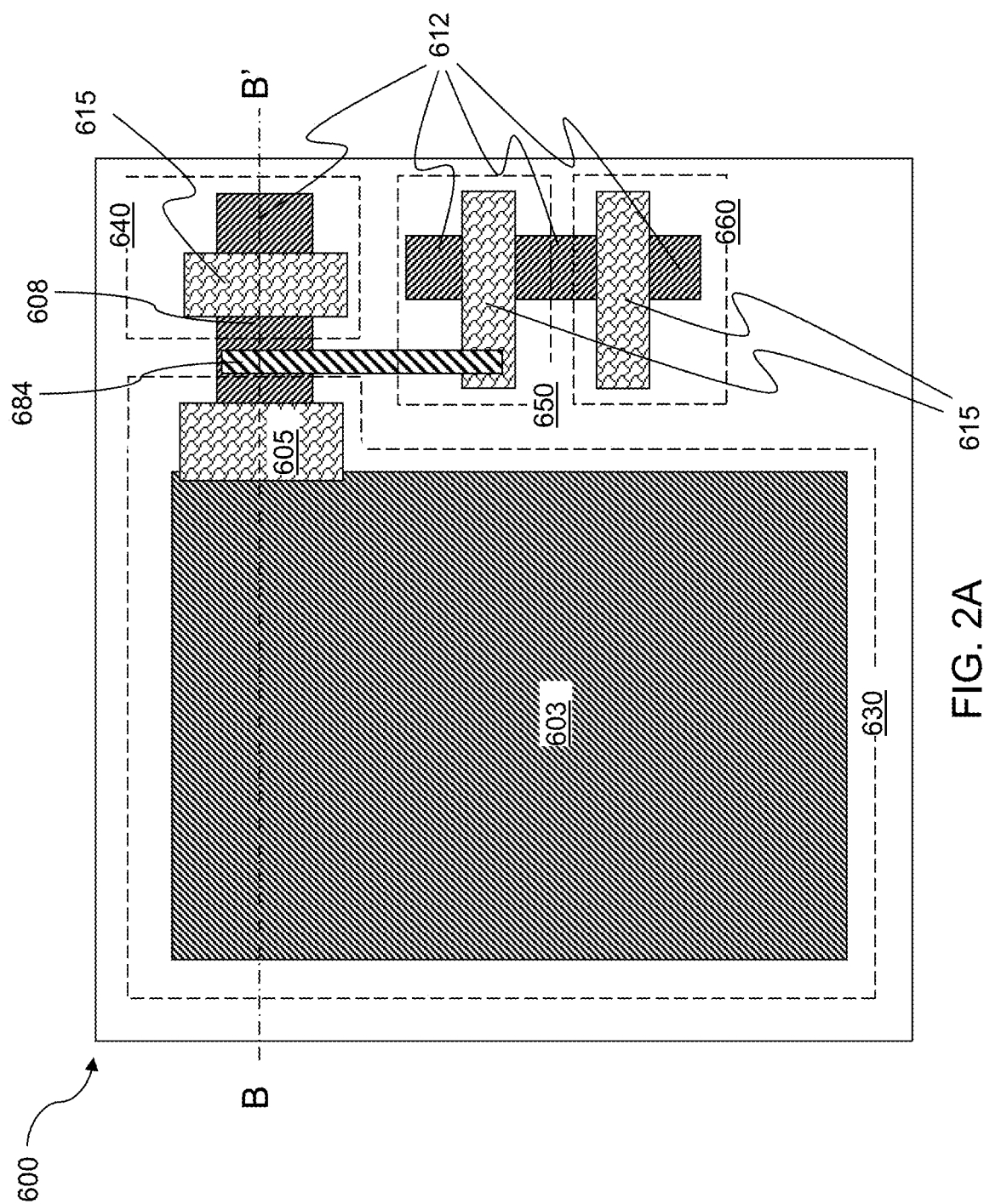
FIG. 2A is a plan view of front side sensor components within the area of a subpixel in an exemplary structure according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure may be used to provide an image sensor having a higher quantum efficiency, which is the fraction of photons that produces an electron-hole pair among all photons that impinge into a photo-reactive material portion. An optical refraction layer having random surface roughness is used to provide random refraction of photons that impinge on a photosensor, which increases the quantum efficiency of the photosensor.

A refractive structure in the optical path of photons within an image sensor may have a beneficial effect by increasing the probability of photon absorption in a photosensor. For example, Z. Y. Wang et al., Broadband optical absorption by tunable Mie resonances in silicon nanocone arrays, Scientific Reports, Vol. 5, Article number: 7810 (2015) describes how an array of refractive pillar structures may increase the absorption coefficient for photons of various wavelengths in the optical range. However, manufacture of such a periodic array of pillars requires lithographic patterning of periodic structures using deep ultraviolet (DUV) lithography, and thus may be a costly process. Embodiments of the present disclosure provide a randomly refractive surface having lateral dimensions on the order of 100 nm by using an anisotropic etch process that produces a randomly refractive surface including random protrusions. Process non-uniformity that provides local variations in the etch thickness in a masking material layer is amplified in an underlying optically transparent material by using an etch chemistry that etches the optically transparent material at a greater etch rate than the material of the masking material layer. The resulting randomly refractive surface is provided in the optical path of impinging photons within an image sensor to enhance the quantum efficiency of the image sensor.

Referring to FIGS. 1A and 1B, a first configuration for an array 1000 of pixels 900 of an image sensor and a second configuration of an array 1000 of pixels 900 of an image sensor are illustrated in a plan view, respectively. The image sensor may be a backside illuminated (BSI) image sensor device. However, it should be appreciated that embodiments of the disclosure may be used in a front side illuminated (FSI) image sensor.

Each pixel 900 represents a smallest unit area for the purpose of generating an image from the image sensor. The region including the array 1000 of pixels 900 is herein referred to as a pixel array region. The pixels 900 in the pixel array region may be arranged in rows and columns. For example, the pixel array region may include M rows and N columns, in which M and N are integers in a range from 1 to $2^{16}$, such as from $2^8$ to $2^{14}$. The rows of pixels 900 may be consecutively numbered with integers that range from 1 to M, and the columns of pixels 900 may be consecutively numbered with integers that range from 1 to N. A pixel Pij refers to a pixel 900 in the i-th row and in the j-th column.

Each pixel 900 includes at least one photosensor that is configured to detect radiation of a given wavelength range. Each pixel 900 may include a plurality of photosensors configured to detect radiation of a respective wavelength range, which may be different among the plurality of photosensors. In one embodiment, each pixel 900 may include a plurality of subpixels, each of which including a respective combination of a photo sensor and an electronic circuit configured to detect radiation that impinged into the photosensor. For example, a pixel 900 may include a subpixel configured to detect radiation in a red wavelength range (such as a range from 635 nm to 700 nm), a subpixel configured to detect radiation in a green wavelength range (such as a range from 520 nm to 560 nm), and a subpixel configured to detect radiation in a blue wavelength range (such as a range from 450 nm to 490 nm). Such subpixels are referred to as a red subpixel, green subpixel, and a blue subpixel, respectively.

Generally, a pixel 900 generates information in impinging radiation for a unit detection area. A subpixel generates information on the intensity of the impinging radiation within a specific wavelength range as detected within a region of the unit detection area. A monochromatic pixel 900 may include only a single subpixel. A pixel 900 configured to detect spectral distribution of impinging radiation includes multiple subpixels having at least two different detection wavelength ranges. Photosensors in a pixel array region may include photodiodes, complimentary metal-oxide-semiconductor (CMOS) image sensors, charged coupling device (CCD) sensors, active sensors, passive sensors, other applicable sensors, or a combination thereof.

Figure 2B:
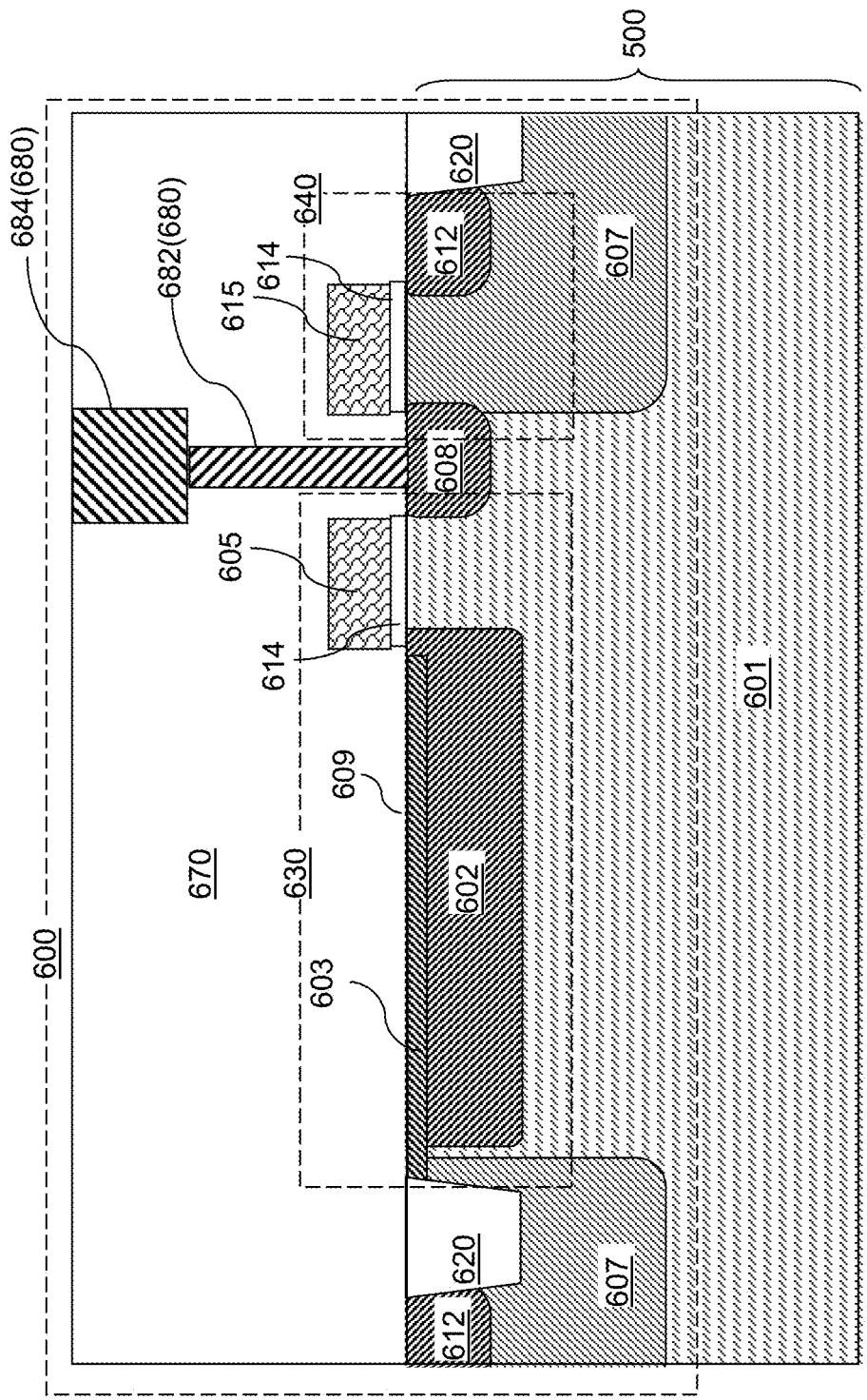
FIG. 2B is a vertical cross-sectional view of the exemplary structure along the vertical plane B-B' of FIG. 2A.

Referring to FIGS. 2A and 2B, front side sensor components 600 within the areas of a subpixel in an image sensor are illustrated. A semiconductor substrate 500 includes a substrate semiconductor layer 601. Front side sensor components 600 include all components of the image sensor that may be formed on the front surface 609 of the semiconductor substrate 500, or may be formed within the substrate semiconductor layer 601. Each subpixel includes a photosensor and a sensing circuit for the photosensor. A set of subpixels may be used for a pixel, and an array 1000 of pixels may be arranged as illustrated in FIG. 1A or in FIG. 1B, or in any other suitable array configurations to provide an image sensor.

Each subpixel may be formed on, or in, the substrate semiconductor layer 601, which has a front surface 609 and a back surface. The substrate semiconductor layer 601 includes a semiconductor material such as silicon, germanium, a silicon-germanium alloy, a compound semiconductor material, or any other semiconductor material having a band gap that that does not exceed the energy of the photons to be detected. The material within the substrate semiconductor layer 601 may be selected based on the energy range of the photons to be detected by the subpixel. In one embodiment, the substrate semiconductor layer 601 may include single crystalline silicon. A commercially available single crystalline semiconductor substrate may be used for the semiconductor substrate 500. The semiconductor substrate 500 as provided at this processing step has a sufficiently high thickness to be able to withstand standard complementary metal-oxide-semiconductor (CMOS) processing steps. For example, the thickness of the semiconductor substrate 500 may be in a range from 200 microns to 1 mm, although lesser and greater thicknesses may also be used.

A top portion of the substrate semiconductor layer 601 may be suitable doped to have a first conductivity type, which may be p-type or n-type. For example, an epitaxial semiconductor deposition process may be performed to form a single crystalline epitaxial semiconductor material layer at an upper portion of the substrate semiconductor layer such that the atomic concentration of the dopants of the first conductivity type is in a range from $1.0 \times 10^{13}/cm^3$ to $1.0 \times 10^{16}/cm^3$, although lesser and greater atomic concentrations may also be used. The thickness of the single crystalline epitaxial semiconductor material layer may be in a range from 1 micron to 10 microns.

First-conductivity-type wells 607 may be formed by ion implantation around regions in which shallow trench isolation structures 620 may be subsequently formed. The atomic concentration of dopants of the first conductivity type in the first-conductivity-type wells 607 may be in a range from $1.0 \times 10^{15}/cm^3$ to $1.0 \times 10^{18}/cm^3$, although lesser and greater atomic concentrations may also be used. Shallow trench isolation structures 620 may be formed to provide electrical isolation from the various components within the subpixel.

Gate structures (614, 605, 615) may be formed over the front surface 609 of the semiconductor substrate 500 by depositing and patterning a layer stack including a gate dielectric layer and a gate electrode layer. Each patterned portion of the layer stack constitutes a gate structure (614, 605, 615), which include a transfer gate structure (614, 605) and control gate structures (614, 615). The transfer gate structure (614, 605) is the gate structure for a transfer transistor 630, and includes a stack of a gate dielectric 614 and a transfer gate electrode 605. Each of the control gate structures (614, 615) includes a respective layer stack of a gate dielectric 614 and a gate electrode 615 of other transistors in a sensing circuit, which may include a reset transistor 640, a source-follower transistor 650, a select transistor 660, and other suitable transistors that may be used to amplify the signal generated by the photosensor of the subpixel.

Dopants of a second conductivity type may be implanted through the front surface 609 of the semiconductor substrate 500 using at least one masked ion implantation process. The second conductivity type is the opposite of the first conductivity type. For example, if the first conductivity type is p-type, the second conductivity type is n-type, and vice versa. Various doped regions having a doping of the second conductivity type may be formed by the at least one masked ion implantation process. A second-conductivity-type pinned photodiode layer 602 may be formed underneath the front surface 609 of the semiconductor substrate 500 such that a periphery of the second-conductivity-type pinned photodiode layer 602 overlaps with an edge of the transfer gate electrode 605 in a plan view. Various active regions (608, 612) having a doping of the second conductivity type may be formed, which include a floating diffusion region 608 that functions as the drain region of the transfer transistor 630. The second-conductivity-type pinned photodiode layer 602 accumulates electrical charges (such as electrons in case the second conductivity type is n-type) during sensing (i.e., while the subpixel actively detects the photons impinging thereupon, for example, for the purpose of taking a frame or a photo) functions as the source region of the transfer transistor 630. The active regions 612 include source regions and drain regions of the various transistors (640, 650, 660) in the sensing circuit.

A first-conductivity-type pinning layer 603 may be formed directly on top of the second-conductivity-type pinned photodiode layer 602 by ion implantation of dopants of the first conductivity type. The first-conductivity-type pinning layer 603 may suppress depletion of the interface between the second-conductivity-type pinned photodiode layer 602 and the first-conductivity-type pinning layer 603, and electrically stabilizes the second-conductivity-type pinned photodiode layer 602.

Interconnect-level dielectric layers 670 may be formed over the front surface 609 of the semiconductor substrate 500, and metal interconnect structures 680 (including metal line structure 684 and metal via structure 682) connecting the various nodes of the transistors (630, 640, 650, 660) may be formed within each subpixel. The interconnect-level dielectric layers 670 may include a respective dielectric material such as undoped silicate glass, a doped silicate glass, organosilicate glass, a porous dielectric material, or combinations thereof. Dielectric liners including various dielectric materials (such as silicon nitride, silicon oxynitride, silicon oxide carbide, and/or dielectric metal oxides) may be optionally used in the interconnect-level dielectric layers 670. The metal interconnect structures 680 may include various metal via structures 682 and various metal line structures 684. For example, the floating diffusion region 608 may be connected to the gate electrode 615 of the source-follower transistor 650 by a subset of the metal interconnect structures 680. A photosensor may comprise a transfer transistor 630, and may be connected to a sense circuit including additional transistors (640, 650, 660).

Figure 3:
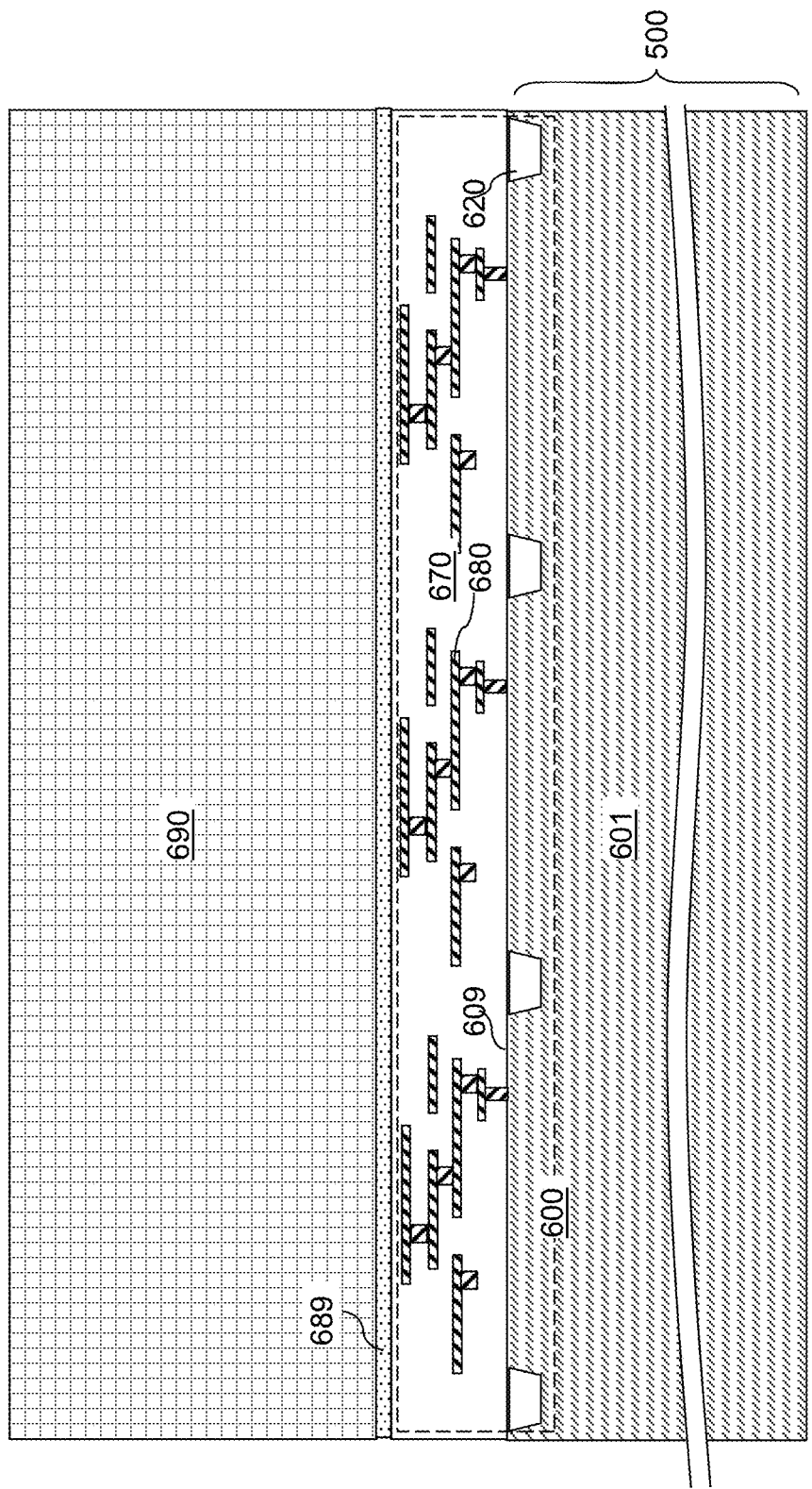
FIG. 3 is a vertical cross-sectional view of the exemplary structure after formation of metal interconnect structures formed in interconnection-level dielectric layers and attachment of a carrier substrate according to an embodiment of the present disclosure.

Referring to FIG. 3, additional interconnect-level dielectric layers 670 and additional metal interconnect structures 680 may be formed on the front side of the semiconductor substrate 500. The front side of the assembly of the semiconductor substrate 500, the interconnect-level dielectric layers 670, and the structures formed therein may be bonded to a carrier substrate 690. The carrier substrate 690 may be temporarily attached to the assembly of the semiconductor substrate 500 and the interconnect-level dielectric layers 670 to enable subsequent thinning of the semiconductor substrate 500, and to enable subsequent handling of the assembly of a thinned semiconductor substrate 500 and the interconnect-level dielectric layers 670. The carrier substrate 690 may include a semiconductor material, an insulating material, or a metallic material, and may have a thickness in a range from 300 microns to 1 mm, although lesser and greater thicknesses may also be used.

Any suitable bonding method may be used to bond the carrier substrate 690 to the front side of the interconnect-level dielectric layers 670. Exemplary bonding methods that may be used to bond the carrier substrate 690 to the interconnect-level dielectric layers 670 include, but are not limited to, oxide-to-oxide bonding, oxide-to-semiconductor bonding, fusion bonding, hybrid bonding, anodic bonding, direct bonding, other suitable bonding processes, and/or combinations thereof. Other suitable bonding techniques within the contemplated scope of disclosure may be used. Optionally, a bonding buffer layer 689 including an intermediate bonding material (e.g., silicon oxide, silicon nitride, or a semiconductor material) may be used to provide bonding between the interconnection-level dielectric layers 670 and the carrier substrate 690.

Figure 4:
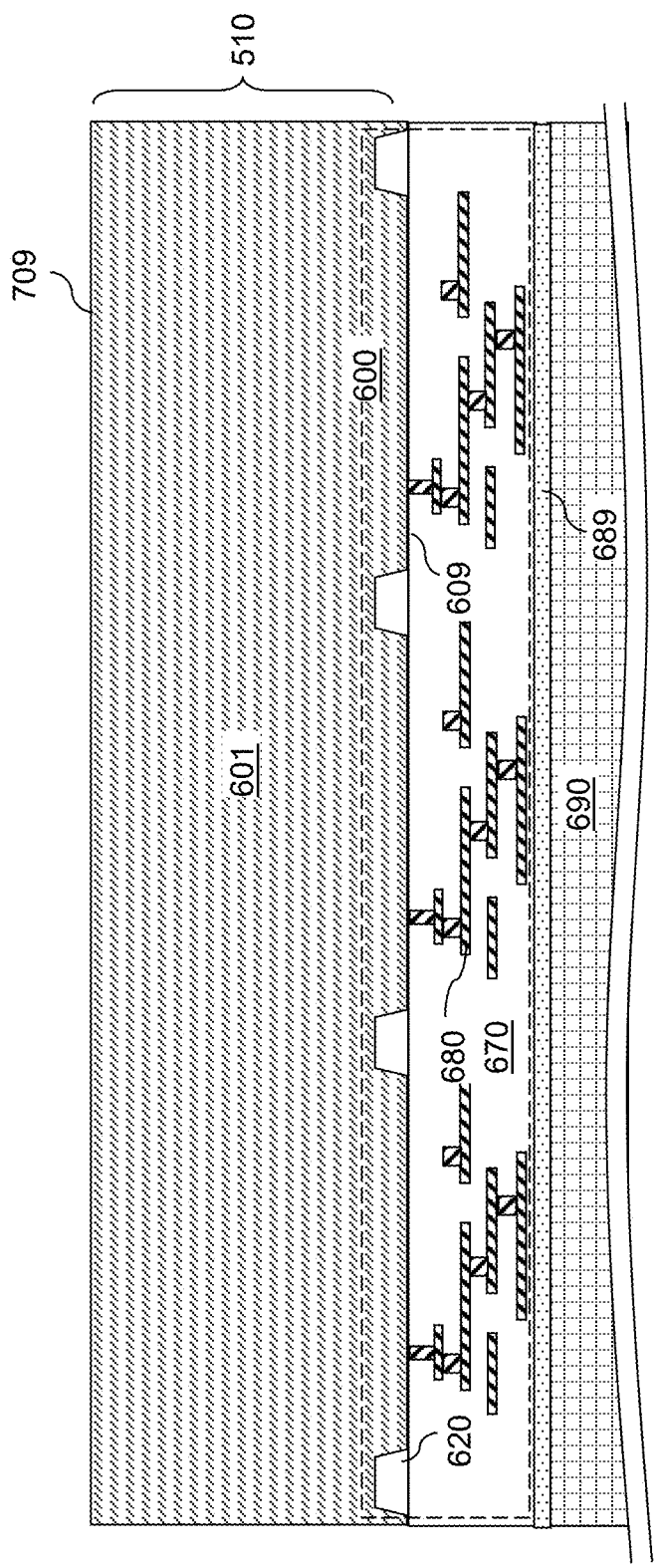
FIG. 4 is a vertical cross-sectional view of the exemplary structure after thinning a semiconductor substrate according to an embodiment of the present disclosure.

Referring to FIG. 4, the backside of the semiconductor substrate 500 may be thinned, for example, by grinding, polishing, an isotropic etch process, and/or an anisotropic etch process. The carrier substrate 690 may provide mechanical support to the semiconductor substrate 500 during the thinning process. In one embodiment, the semiconductor substrate 500 may be thinned to a thickness in a range from 1 micron to 12 microns, such as from 1.5 microns to 8 microns. The semiconductor substrate 500 as thinned after the thinning process is herein referred to as a thinned semiconductor substrate 510, or as a semiconductor substrate 500. The thickness of the thinned semiconductor substrate 510 may be determined by the maximum depth of deep trenches to be subsequently formed on the backside of the thinned semiconductor substrate 510. In one embodiment, the thickness of the thinned semiconductor substrate 510 may be selected such that deep trenches to be subsequently formed on the backside of the semiconductor substrate 510 reaches proximal surfaces of the shallow trench isolation structures 620. The backside surface 709 of the thinned semiconductor substrate 510 may be polished to provide a planar horizontal surface that is parallel to the front surface 609 of the thinned semiconductor substrate 510. The exemplary structure may be subsequently flipped upside down for further processing.

Figure 5:
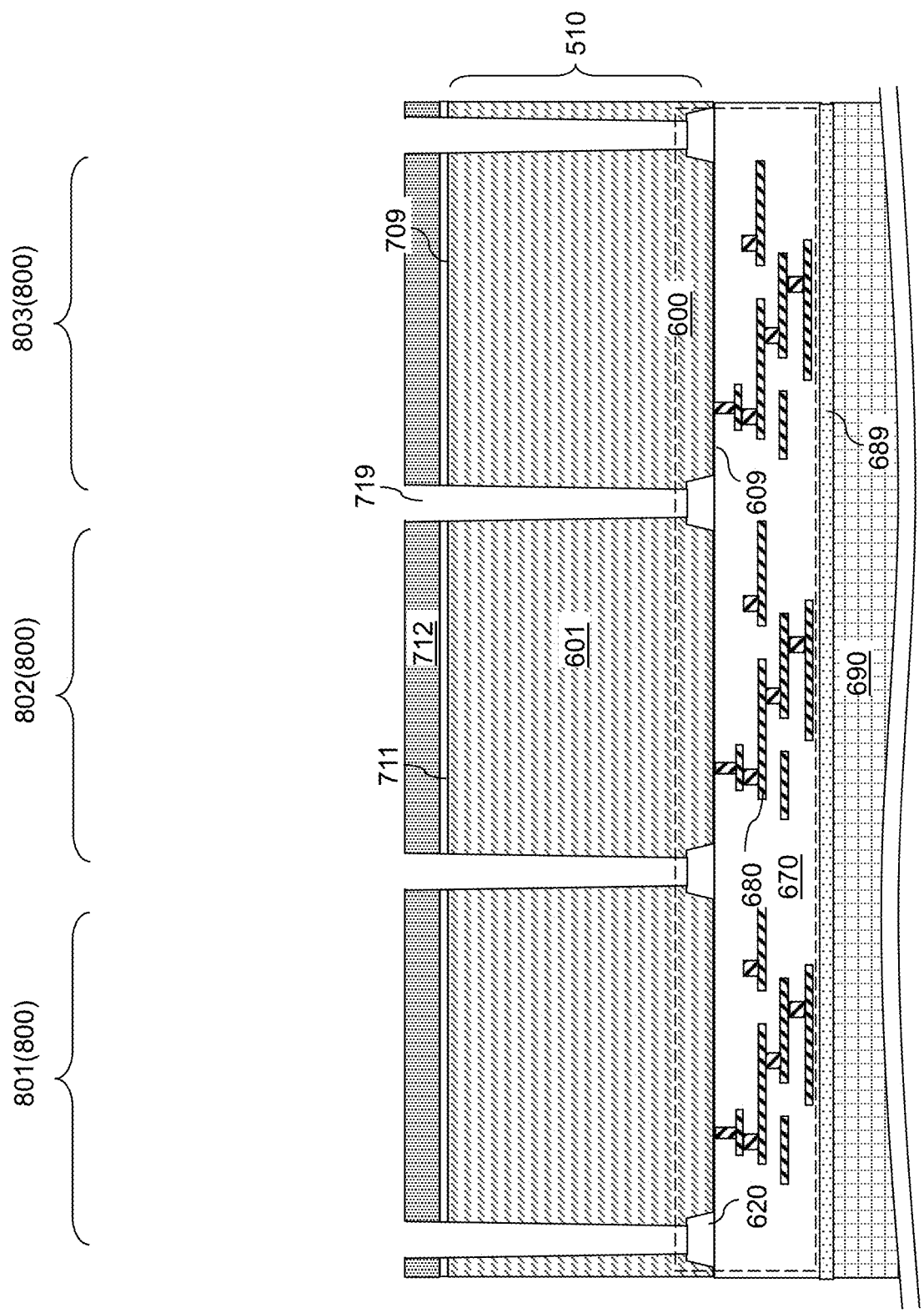
FIG. 5 is a vertical cross-sectional view of the exemplary structure after formation of deep trenches on the backside of the semiconductor substrate according to an embodiment of the present disclosure.

Referring to FIG. 5, an optional pad dielectric layer 711 and a hard mask layer 712 may be formed over the backside surface 709 of the semiconductor substrate 510. The optional pad dielectric layer 711, if present, may include a silicon oxide layer, and may have a thickness in a range from 5 nm to 50 nm. The hard mask layer 712 includes an etch mask material that may be subsequently removed selective to the pad dielectric layer 711 and/or selective to the semiconductor substrate 510. For example, the hard mask layer 712 may include silicon nitride, borosilicate glass, or a metallic material. The hard mask layer 712 may have a thickness in a range from 50 nm to 800 nm, although lesser and greater thicknesses may also be used.

A photoresist layer (not shown) may be applied over the hard mask layer 712, and may be lithographically patterned to form openings that generally replicate the pattern of the shallow trench isolation structures 620 located underneath. A first etch process may be performed to transfer the pattern in the photoresist layer through the hard mask layer 712 and the optional pad dielectric layer 711. Unmasked portions of the semiconductor substrate 510 may be etched by performing a second anisotropic etch process, which transfers the pattern of the openings in the photoresist layer and the hard mask layer 712 through the semiconductor substrate 510 to a top surface of a respective one of the shallow trench isolation structures 620. The depth of the deep trenches 719 may be in a range from 1 micron to 10 microns, such as from 1.5 microns to 8 microns. The photoresist layer may be completely consumed during the second anisotropic etch process. Deep trenches 719 may be formed through the semiconductor substrate 510.

The deep trenches 719 may define areas for subpixels 800. Each subpixel 800 may be located within a respective subpixel region, which is located within a region of a pixel, i.e., within a pixel region. For example, an area of a pixel may include an area of a first subpixel 801, an area of a second subpixel 802, and an area of a third subpixel 803. In an illustrative example, the first subpixel 801 may be formed in a region that includes a photosensor configured to detect green light, the second subpixel 802 may be formed in a region that includes a photosensor configured to detect red light, and the third subpixel 803 may be formed in a region that includes a photosensor configured to detect blue light. Each subpixel 800 may include a volume containing a patterned columnar portion of the semiconductor substrate 510 that may be laterally enclosed by a contiguously connected set of deep trenches 719. A pixel region of a pixel includes all subpixel regions for the set of subpixels 800 contained within the pixel.

Figure 6:
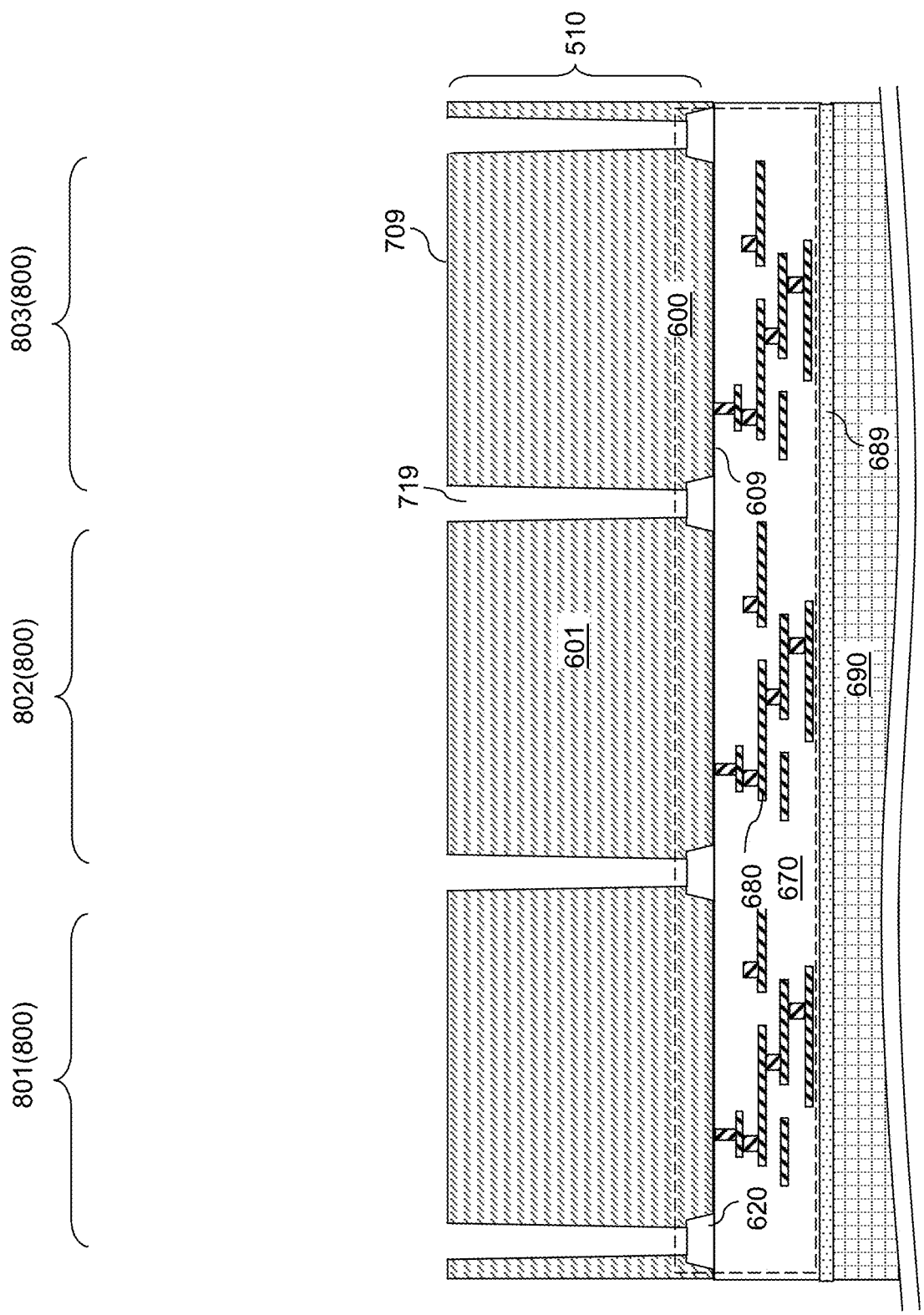
FIG. 6 is a vertical cross-sectional view of the exemplary structure after removal of a hard mask layer and a pad dielectric layer according to an embodiment of the present disclosure.

Referring to FIG. 6, the hard mask layer 712 may be removed selective to the semiconductor substrate 510, the pad dielectric layer 711, and the shallow trench isolation structures 620. In an illustrative example, if the hard mask layer 712 includes silicon nitride, a wet etch process using hot phosphoric acid may be performed to remove the hard mask layer 712. Subsequently, the pad dielectric layer 711 may be removed selective to the semiconductor substrate 510.

Figure 7:
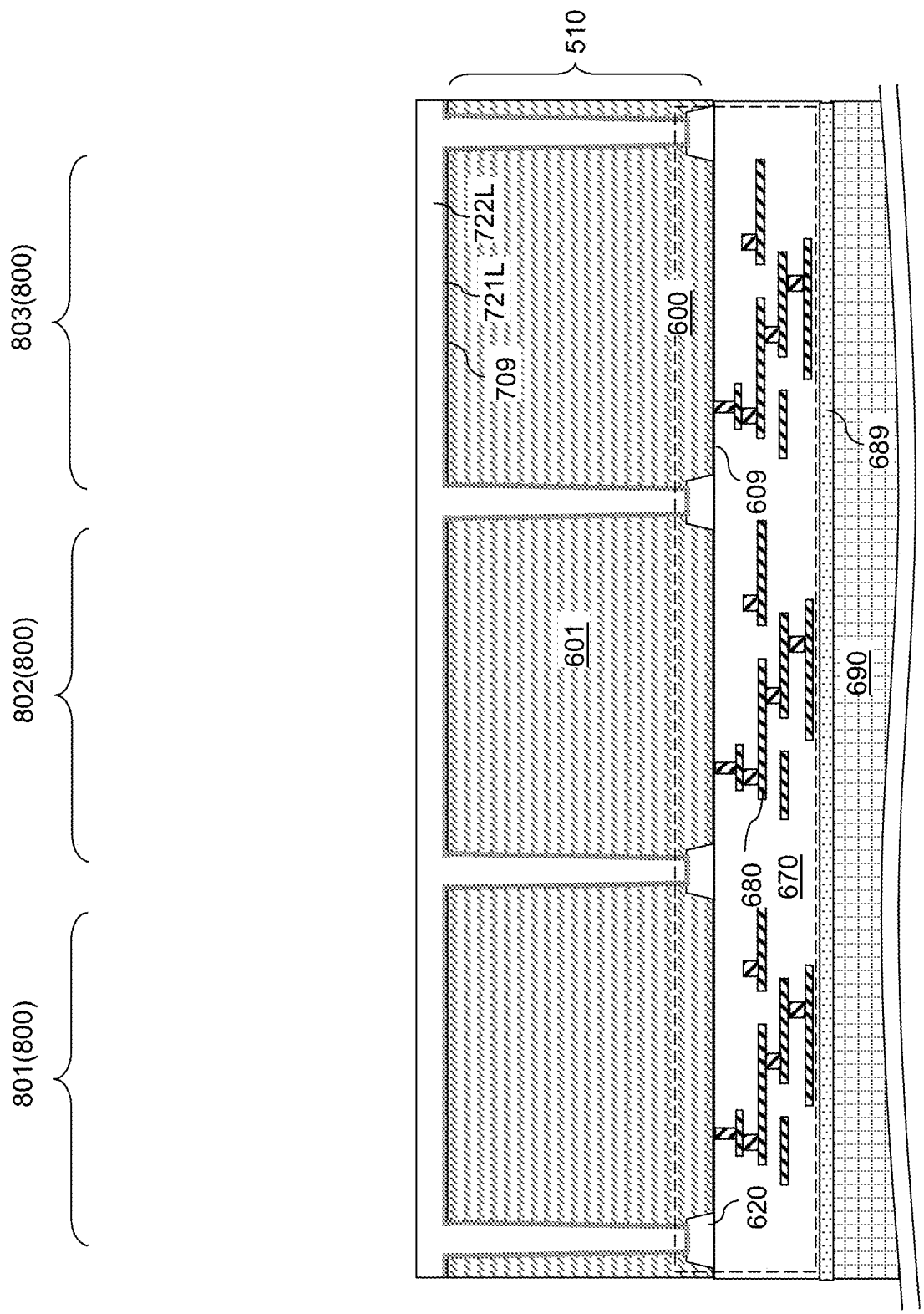
FIG. 7 is a vertical cross-sectional view of the exemplary structure after formation of a dielectric metal oxide liner and a dielectric isolation layer according to an embodiment of the present disclosure.

Referring to FIG. 7, a dielectric metal oxide liner 721L may be conformally deposited over the physically exposed surfaces of the semiconductor substrate 510. The dielectric metal oxide liner 721L may be formed on the sidewalls of the deep trenches 719, on the backside surface 709 of the semiconductor substrate 510, and on surfaces of the shallow trench isolation structures 620 in case the shallow trench isolation structures 620 are physically exposed to the deep trenches 719. The dielectric metal oxide liner 721L includes a dielectric metal oxide material having a dielectric constant greater than 7.9 (i.e., a "high-k" dielectric material). Other suitable high-k dielectric materials may also be used. For example, high-k dielectric materials may have a dielectric constant in a range such as from 7.9 to 100. Exemplary dielectric metal oxide materials that may be used for the dielectric metal oxide liner 721L include hafnium oxide, aluminum oxide, zirconium oxide, magnesium oxide, calcium oxide, yttrium oxide, tantalum oxide, strontium oxide, titanium oxide, lanthanum oxide, barium oxide or combinations thereof. Other suitable materials are within the contemplated scope of disclosure. The dielectric metal oxide liner 721L may be deposited using a chemical vapor deposition process or an atomic layer deposition (ALD). The thickness of the dielectric metal oxide liner 721L may be in a range from 2 nm to 6 nm, although lesser and greater thicknesses may also be used.

The dielectric metal oxide liner 721L may be formed to provide negative charge trapping. For example, the dielectric metal oxide liner 721L may be deposited with a non-stoichiometric oxygen-rich composition, or may be surface-treated, for example, with plasma, to have a non-stoichiometric oxygen-rich surface compression. In this case, the dielectric metal oxide liner 721L may include an oxygen-rich dielectric metal oxide material with negatively charged interstitial oxygen atoms and/or dangling or broken metal oxide bonds, thereby providing accumulation of negative charges within the dielectric metal oxide liner 721L. In an illustrative example, the areal density of accumulated negative charges within the dielectric metal oxide liner 721L may be in a range from $5.0 \times 10^9$ electrons per $cm^2$ to $1.0 \times 10^{14}$ electrons per $cm^2$, such as from $1.0 \times 10^{10}$ electrons per $cm^2$ to $2.0 \times 10^{13}$ electrons per $cm^2$. The dielectric metal oxide material used in the dielectric metal oxide liner 721L may accumulate more negative charges than other dielectric materials such as silicon nitride or silicon oxide. The negative charge in the dielectric metal oxide liner 721L increases hole accumulation within interfacial portions of the first-conductivity-type wells 607 and the substrate semiconductor layer 601 of the semiconductor substrate 510. A depletion region may be formed within portions of the first-conductivity-type wells 607 and the substrate semiconductor layer 601 of the semiconductor substrate 510 that are proximal to the dielectric metal oxide liner 721L. The depletion region reduces dark current and/or white pixels for the image sensor.

A dielectric isolation layer 722L may be formed by conformally depositing a dielectric material in remaining volumes of the deep trenches 719. The dielectric isolation layer 722L includes a dielectric material such as undoped silicate glass, a doped silicate glass (such as borosilicate glass), or a combination thereof. The combination of the dielectric metal oxide liner 721L and the dielectric isolation layer 722L may fill the deep trenches 719 (with or without seams and/or encapsulated cavities).

Figure 8:
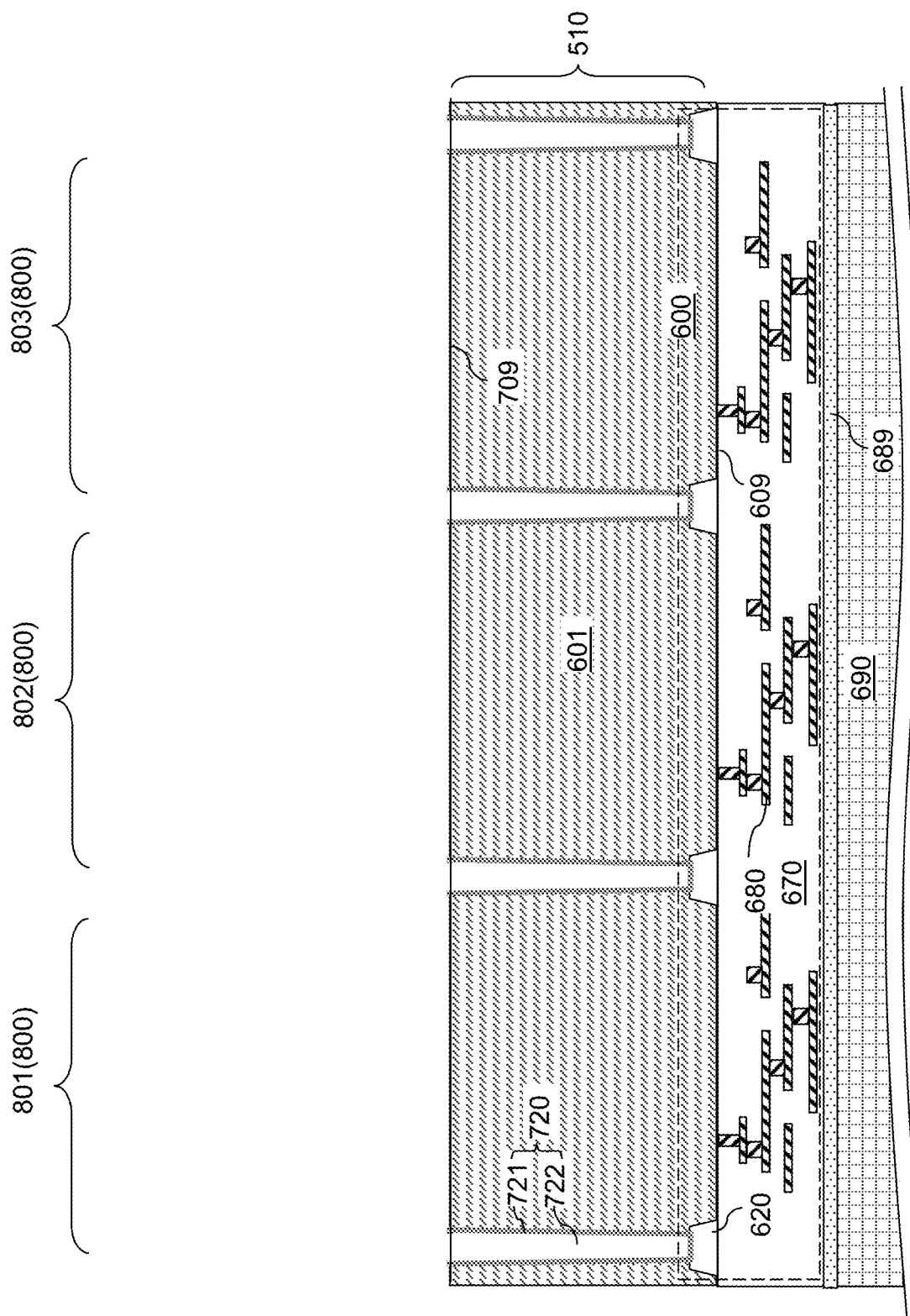
FIG. 8 is a vertical cross-sectional view of the exemplary structure after formation of deep trench isolation structures according to an embodiment of the present disclosure.

Referring to FIG. 8, horizontal portions of the dielectric isolation layer 722L and the dielectric metal oxide liner 721L may be removed from above the backside surface 709 of the semiconductor substrate 510 by a planarization process. A recess etch and/or a chemical mechanical planarization process may be used to remove the horizontal portions of the dielectric isolation layer 722L and the dielectric metal oxide liner 721L. In one embodiment, the dielectric metal oxide liner 721 may be used as an etch stop layer during a recess etch process that removes the horizontal portions of the dielectric isolation layer 722, or as a stopping layer during a chemical mechanical planarization process that removes the horizontal portions of the dielectric isolation layer 722. The horizontal portions of the dielectric metal oxide liner 721 that overlies the backside surface 709 of the semiconductor substrate 510 may be subsequently removed by performing an isotropic etch process (such as a wet etch process) that etches the material of the dielectric metal oxide liner 721 selective to the semiconductor material of the semiconductor substrate 510. Remaining vertically-extending portions of the dielectric metal oxide liner 721 and the dielectric isolation layer 722 fill the deep trenches 719, and are herein referred to as deep trench isolation structures 720.

Figure 9:
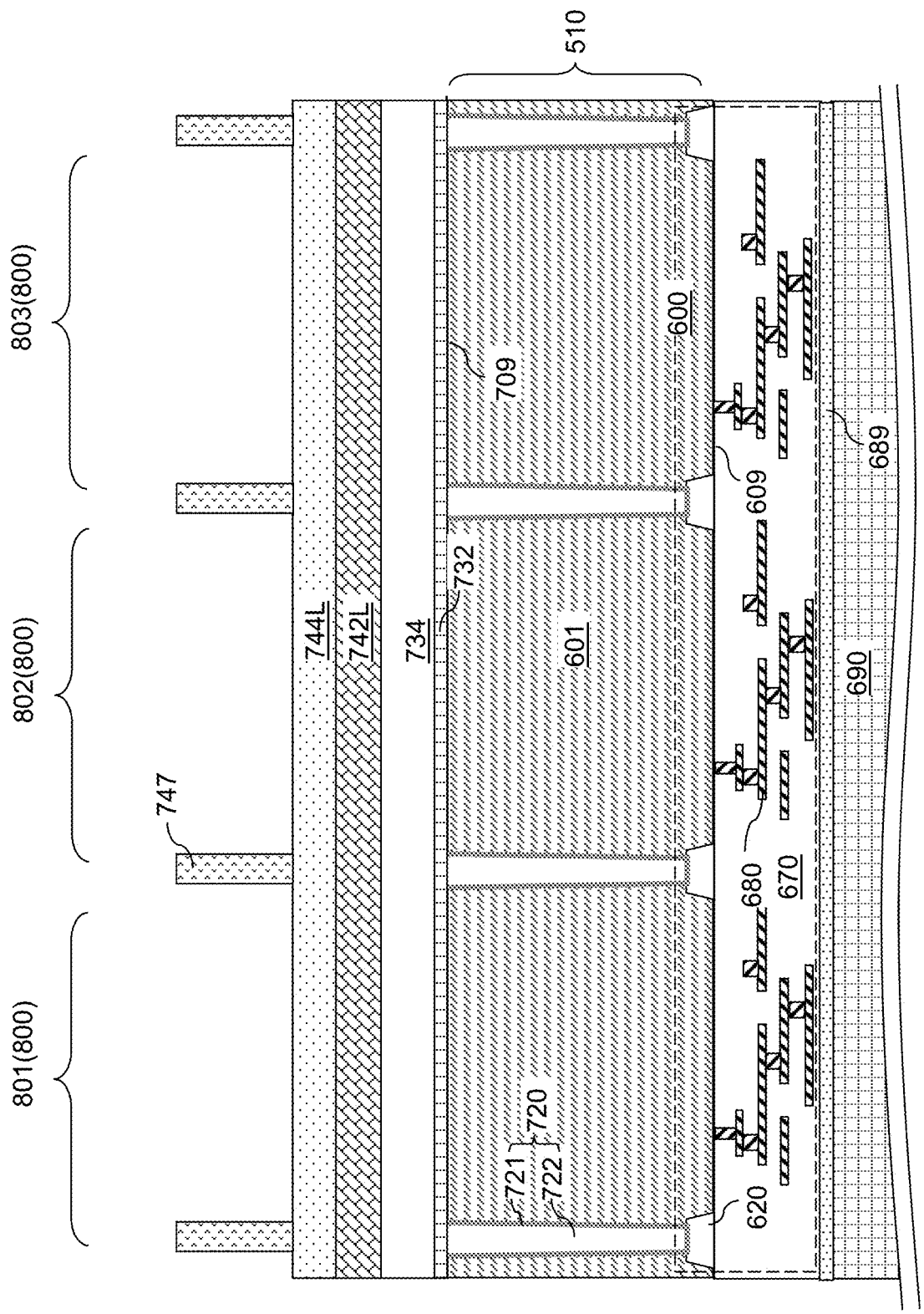
FIG. 9 is a vertical cross-sectional view of the exemplary structure after formation of an antireflective coating (ARC) layer, an optical refraction layer, a dielectric grid material layer, a metallic reflective material layer, and a patterned photoresist layer according to an embodiment of the present disclosure.

Referring to FIG. 9, an optional antireflective coating (ARC) layer 732, an optical refraction layer 734, a dielectric grid material layer 742L, and a metallic reflective material layer 744L may be sequentially deposited over the backside surface 709 of the semiconductor substrate 510.

The optional ARC layer 732 may include an antireflective coating material that reduces reflection between the semiconductor material of the semiconductor substrate 510 and the overlying material layer, i.e., the optical refraction layer 734. The optional ARC layer 732, if present, may have a refractive index that is between the refractive index of the semiconductor material of the semiconductor substrate 510 and the refractive index of the optical refraction layer 734. The optional ARC layer 732 may include a single material layer or a layer stack of multiple layers having gradually changing refractive indices. The optional ARC layer 732 includes an optically transparent material, and may include a semiconductor material, an insulating material, a conductive material, and/or a polymer material. The ARC layer 732 may have a thickness in a range from 50 nm to 300 nm, although lesser and greater thicknesses may also be used.

The optical refraction layer 734 may include a semiconductor material (such as silicon, germanium, a silicon-germanium alloy, or a III-V compound semiconductor material) or a dielectric material (such as silicon oxide, silicon oxynitride, silicon nitride, or a dielectric metal oxide (e.g., aluminum oxide). The optical refraction layer 734 may include a material that is conducive to the formation of trenches having a high aspect ratio during a subsequent anisotropic etch process. The optical refraction layer 734 may be formed as an un-patterned (blanket) material layer having two horizontal planar surfaces that are parallel to the backside surface 709 of the semiconductor substrate 510. The distal surface of the optical refraction layer 734 may be one of the two horizontal planar surfaces of the optical refraction layer 734 that is more distal from the semiconductor substrate 510, i.e., a top surface of the optical refraction layer 734.

The dielectric grid material layer 742L may include a dielectric material such as silicon oxide, a porous dielectric material, polyimide, or another dielectric material. The thickness of the dielectric grid material layer may be in a range from 50 nm to 500 nm, although lesser and greater thicknesses may also be used. The metallic reflective material layer 744L may include a metallic material that may provide high reflectivity. For example, the metallic reflective material layer 744L may include silver, aluminum, copper, gold, or any other highly reflective metallic material. The thickness of the metallic reflective material layer 744L may be in a range from 50 nm to 500 nm, although lesser and greater thicknesses may also be used.

A photoresist layer 747 may be applied over the metallic reflective material layer 744L, and may be lithographically patterned to form openings within areas of the second-conductivity-type pinned photodiode layers 602, i.e., within the areas of the photosensors that include a respective p-n junction between the second-conductivity-type pinned photodiode layers 602 and the first-conductivity-type wells 607. The areas of the transistors of the sensing circuit (such as the reset transistors 640, the source-follower transistors 650, and the select transistors 660) may, or may not, be covered by the photoresist layer 747.

Figure 10A:
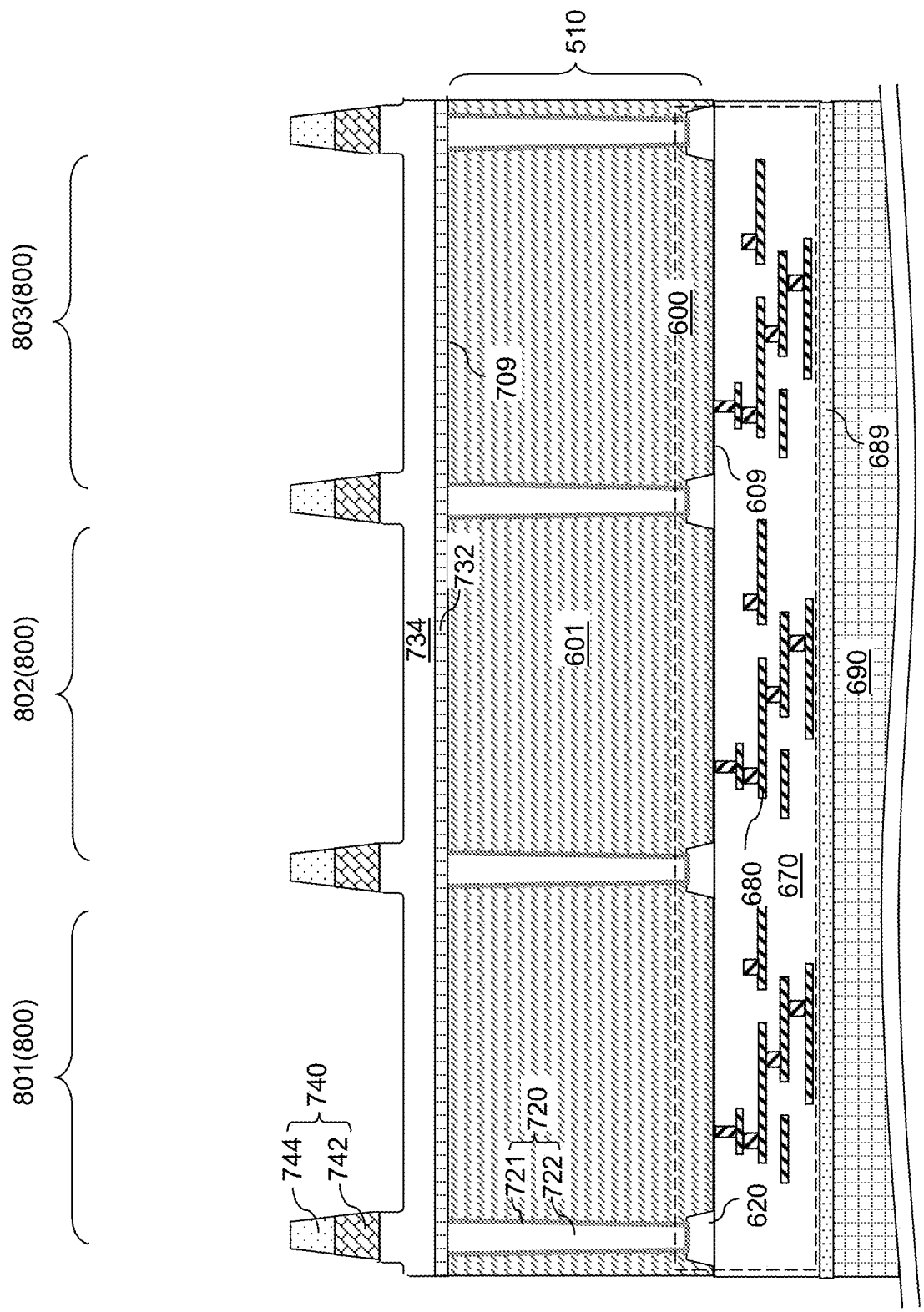
FIG. 10A is a vertical cross-sectional view of the exemplary structure after formation of a composite grid structure according to an embodiment of the present disclosure.
Figure 10B:
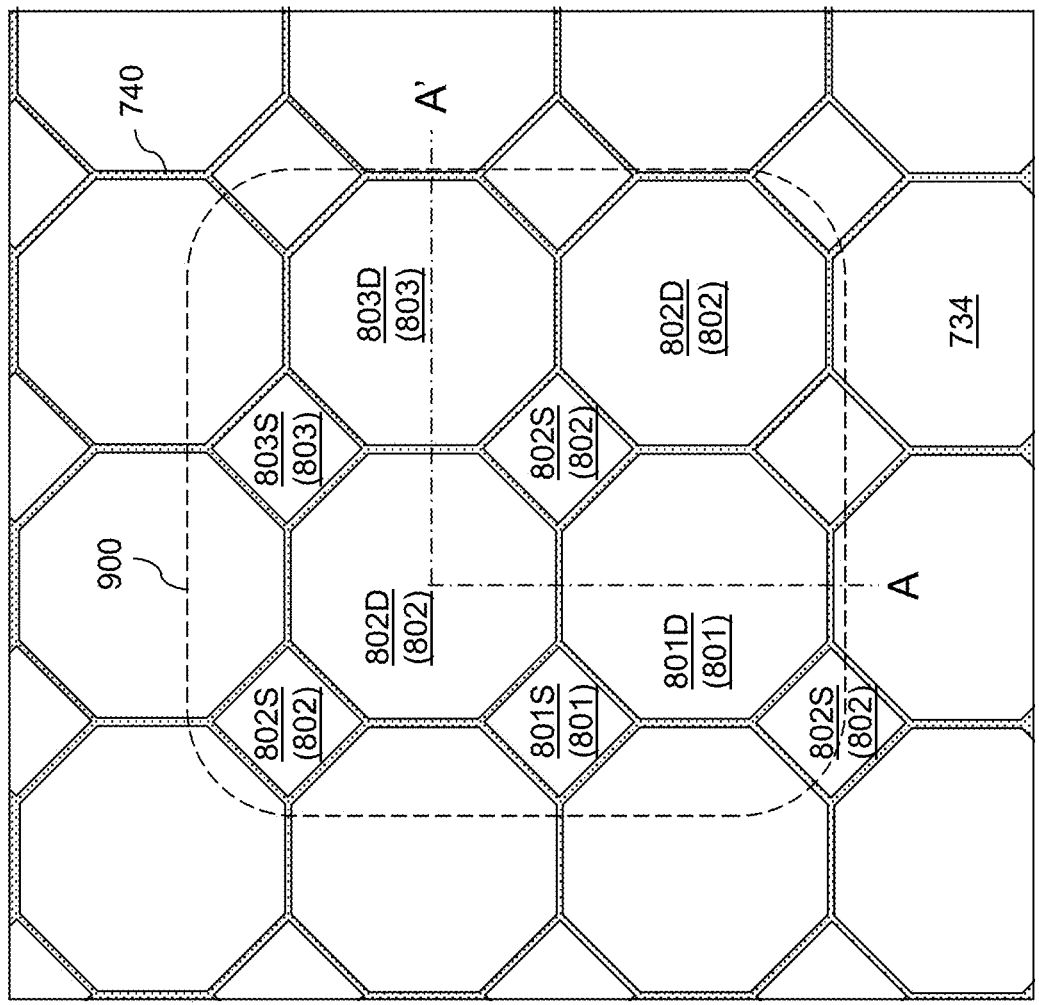
FIG. 10B is a plan view of the exemplary structure of FIG. 10A. The hinged vertical plane A-A' corresponds to the plane of the vertical cross-sectional view of FIG. 10A.

Referring to FIGS. 10A and 10B, portions of the dielectric grid material layer 742L and the metallic reflective material layer 744L that are not masked by the patterned portions of the photoresist layer 747 may be etched to form openings therethrough. Remaining portions of the dielectric grid material layer 742L form a dielectric grid structure 742, and remaining portions of the metallic reflective material layer 744L form a metallic grid structure 744. The stack of the dielectric grid structure 742 and the metallic grid structure 744 constitutes a grid structure 740, which is also referred to as a composite grid structure.

The grid structure 740 may overlie peripheries of the second-conductivity-type pinned photodiode layers 602, and define a light collection area for each photosensor located within a respective subpixel 800. A pixel 900 may include a set of subpixels configured to detect light at different wavelengths. Each pixel 900 may be located within a respective pixel region, which includes a set of subpixels 800. For example, a pixel 900 may include at least one instance of a first subpixel 801, at least one instance of a second subpixel 802, and at least one instance of a third subpixel 803. In the illustrated example, a pixel may include a first subpixel 801 (such as a green subpixel) located in a first subpixel region, two second subpixels 802 (such as two red subpixels) located in two second subpixel regions, and a third subpixel 803 (such as a blue subpixel) located in a third subpixel region. Generally, a pixel 900 may include various combinations of at least two types of subpixels 800 configured to detect light at different wavelength ranges. Alternatively, an image sensor may be a monochromatic image sensor including a single type of subpixels 800. In this case, each pixel 900 may include only a single subpixel 800.

Generally, a grid structure 740 comprises at least a metallic grid structure 744 having reflective sidewalls. The grid structure 740 may comprise a composite grid structure including a vertical stack of a metallic grid structure 744 having reflective sidewalls and a dielectric grid structure 742. The grid structure 740 may be formed over the distal surface of the optical refraction layer 734. The grid structure 740 includes openings that overlie a respective one of the photosensors 630. The portions of the distal surface of the optical refraction layer 734 that are contacted by the bottom surfaces of the grid structure are planar distal surface portions of the distal surface of the optical refraction layer 734. The portions of the distal surface of the optical refraction layer 734 that do not contact the grid structure 740 may be collaterally vertically recessed relative to the horizontal plane including the bottom surface of the grid structure during the anisotropic etch process that patterns the grid structure.

The grid structure 740 may divide each subpixel 800 into a detector region and a sensing circuit region. For example, a first subpixel 801 may include a first detector region 801D that overlies the second-conductivity-type pinned photodiode layer 602 of the first subpixel 801, and a first sensing circuit region 801S that overlies the sensing circuit (640, 650, 660) of the first subpixel 801. A second subpixel 802 may include a second detector region 802D that overlies the second-conductivity-type pinned photodiode layer 602 of the second subpixel 802, and a second sensing circuit region 802S that overlies the sensing circuit (640, 650, 660) of the second subpixel 802. A third subpixel 803 may include a third detector region 803D that overlies the second-conductivity-type pinned photodiode layer 602 of the third subpixel 803, and a third sensing circuit region 803S that overlies the sensing circuit (640, 650, 660) of the third subpixel 803. Generally, the set of all subpixels 800 within a pixel 900 may be arranged in any pattern that is conducive to periodic repetition of the pixels 900 within an array 1000 of pixels 900.

Figure 11A:
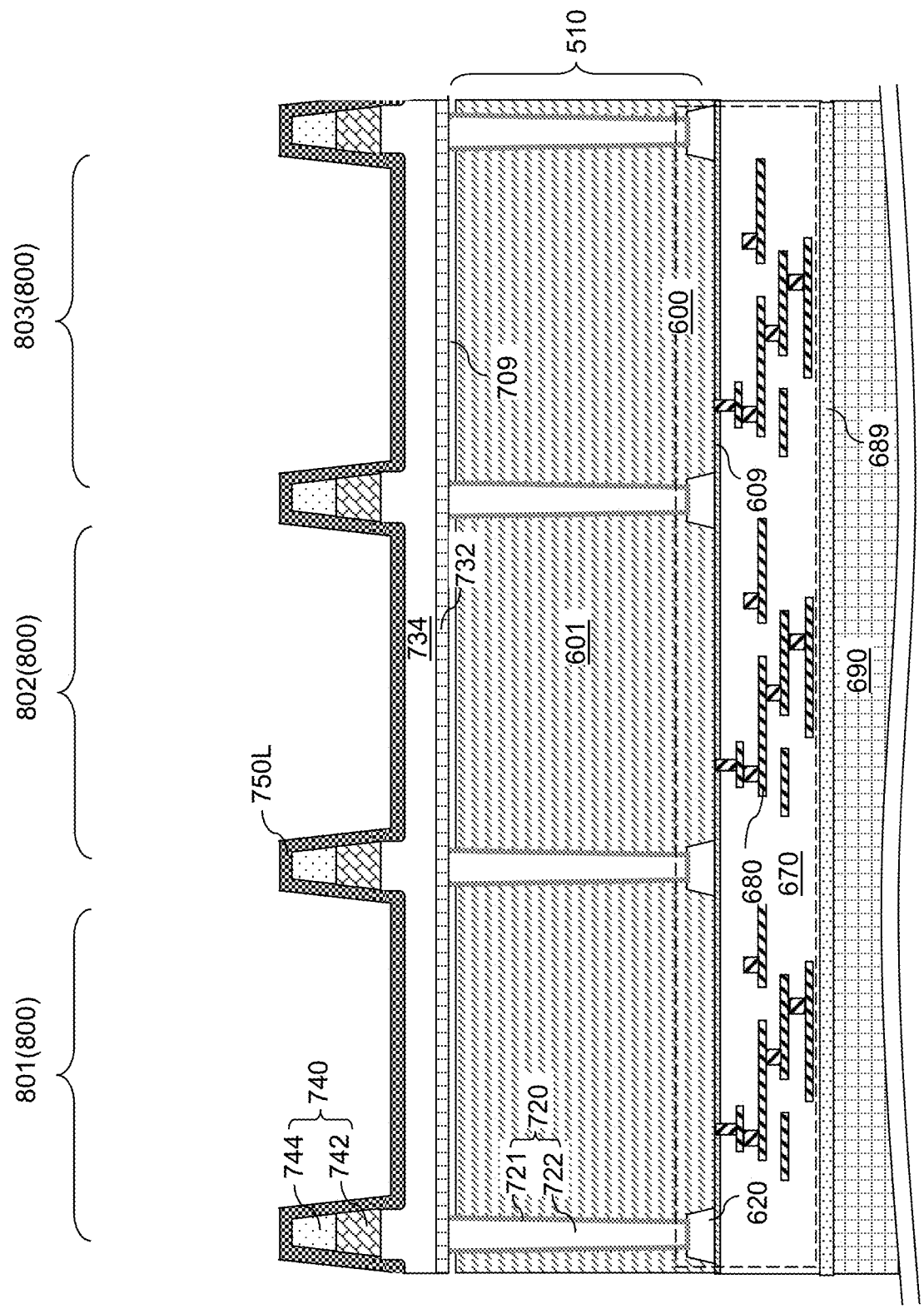
FIG. 11A is a vertical cross-sectional view of the exemplary structure after formation of a masking material layer and a patterned photoresist layer according to an embodiment of the present disclosure.
Figure 11B:
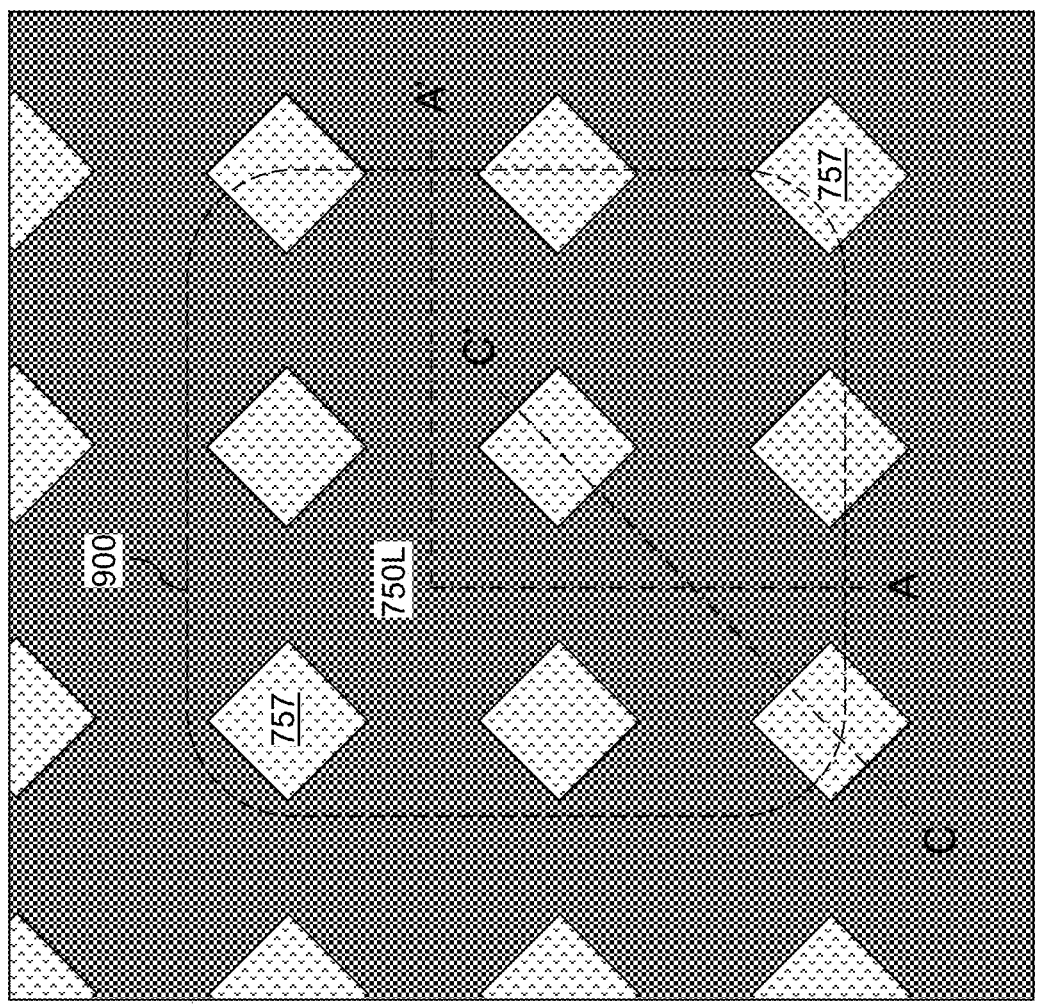
FIG. 11B is a plan view of the exemplary structure of FIG. 11A. The hinged vertical plane A-A' corresponds to the plane of the vertical cross-sectional view of FIG. 11A.
Figure 11C:
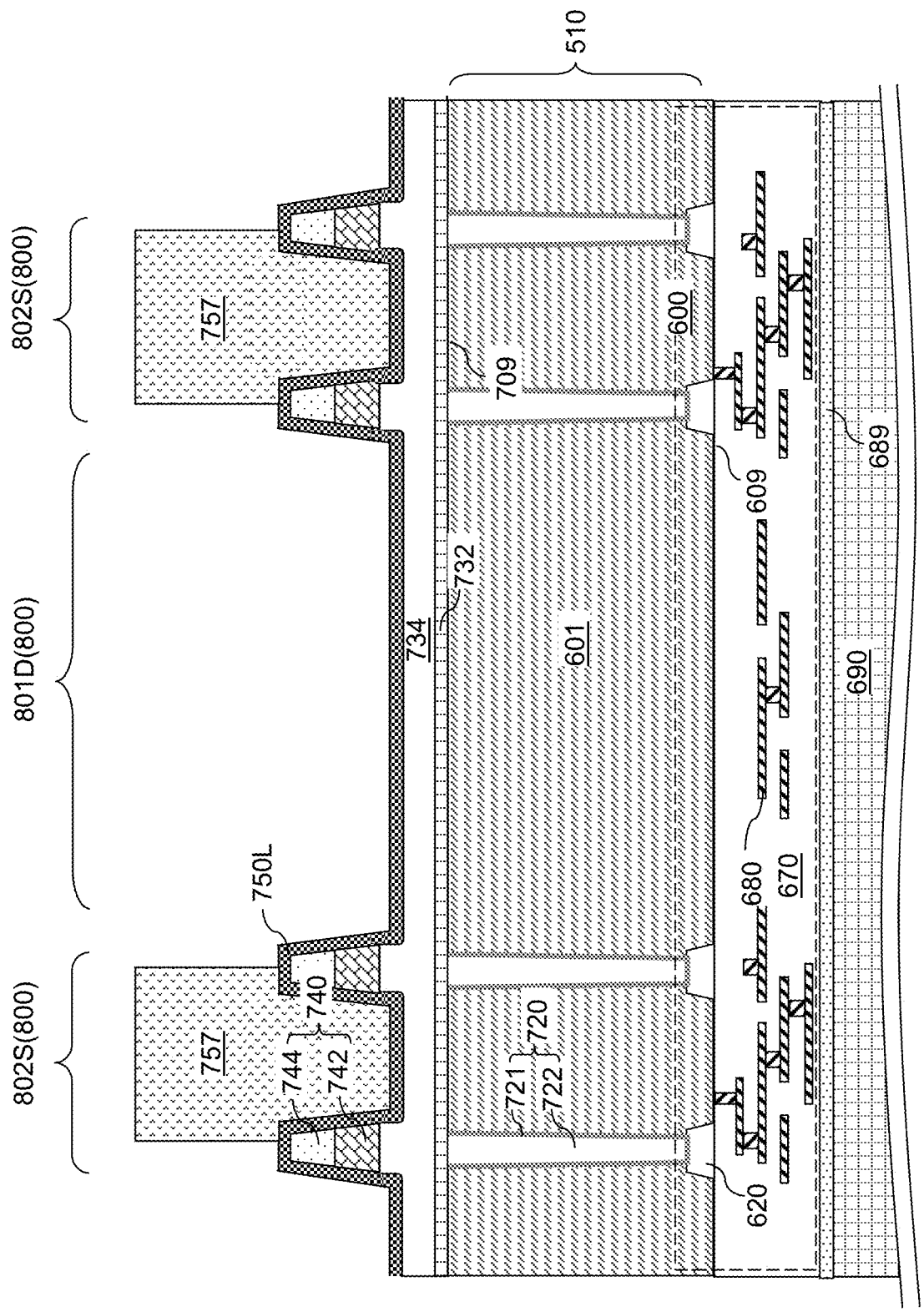
FIG. 11C is a vertical cross-sectional view of the exemplary structure along the vertical plane C-C' of FIG. 11B.

Referring to FIGS. 11A-11C, a masking material layer 750L may be deposited over the grid structure 740 and the optical refraction layer 734. The masking material layer 750L may include a material that may be etched with local etch rate variations in a subsequent anisotropic etch process. For example, the masking material layer 750L may include a material that may be deposited with significant thickness variations during a deposition process, such as a physical vapor deposition process that deposits a material with particle size variations. Additionally, or alternatively, the masking material layer 750L may include a material that provides an enhanced etch rate at grain boundaries. Additionally, or alternatively, the masking material may include a material that exhibits pitting properties in the material during a subsequent anisotropic etch process. Additionally, or alternatively, the masking material may include a material that exhibits a significant etch rate dependence on local plasma conditions during a subsequent anisotropic etch process. Generally, the masking material layer 750L includes a material having an unstable etch rate during a subsequent etch process such that significant local variations in thickness develops during a subsequent anisotropic etch process.

The masking material layer 750L may include a metallic material, a semiconductor material, or a dielectric material. In case a metallic material is used for the masking material layer 750L, the masking material layer 750L may include a conductive metallic liner material such as TiN, TaN, or WN, or a metallic material such a Ti, Ta, or W, or a stack of at least two metallic materials. Other suitable materials are within the contemplated scope of disclosure. In an illustrative example, the masking material layer 750L may include a stack of a titanium nitride layer and a titanium layer. The thickness of the horizontal portion of the masking material layer 750L may be in a range from 20 nm to 100 nm, although lesser and greater thicknesses may also be used.

A photoresist layer 757 may be applied over the masking material layer 750L, and may be lithographically patterned to form openings within the detector regions (801D, 802D, 803D) and mask areas of the sensing circuit regions (801S, 802S, 803S). The patterned portions of the photoresist layer 757 overlie and protect underlying portions of the masking material layer 750L during a subsequent anisotropic etch process. In one embodiment, edges of the patterned portions of the photoresist layer 757 may overlie the areas of the grid structure 740.

Figure 12B:
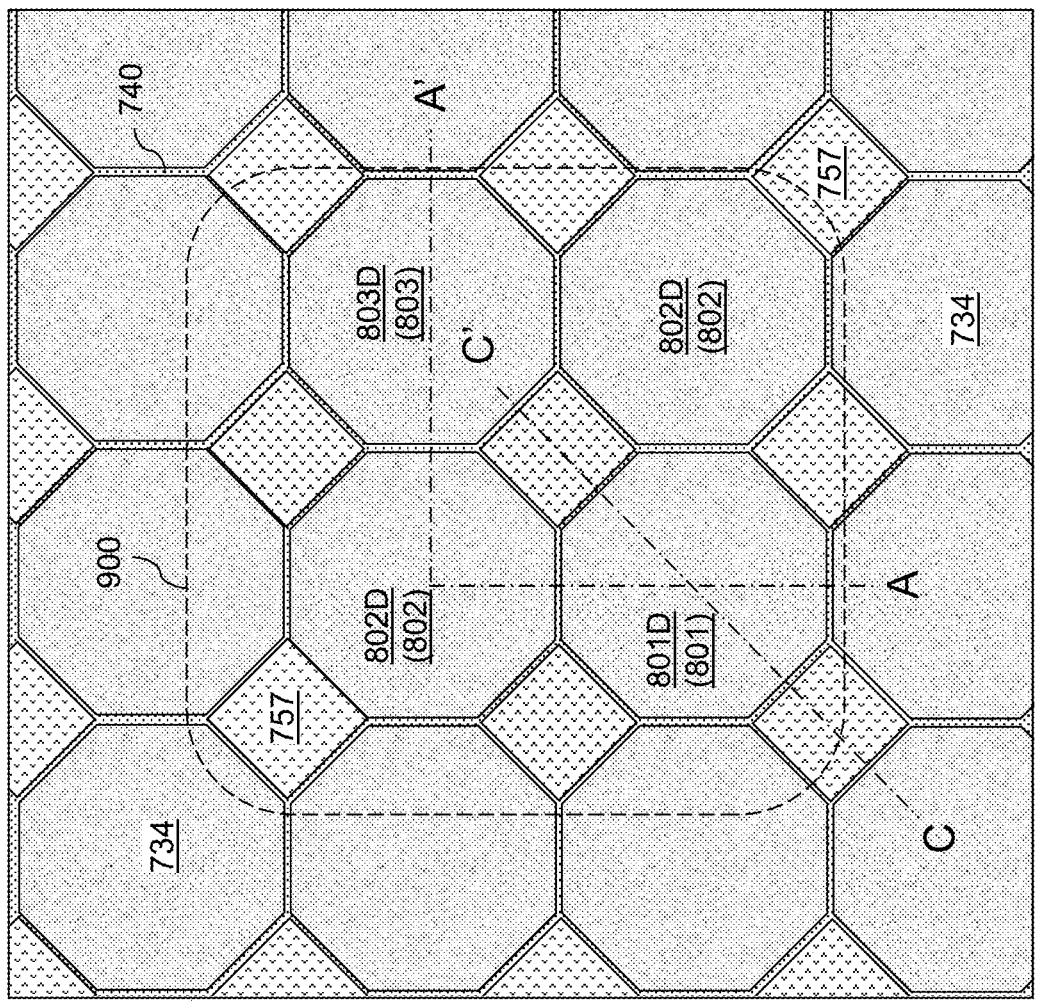
FIG. 12B is a plan view of the exemplary structure of FIG. 12A. The hinged vertical plane A-A' corresponds to the plane of the vertical cross-sectional view of FIG. 12A.
Figure 12C:
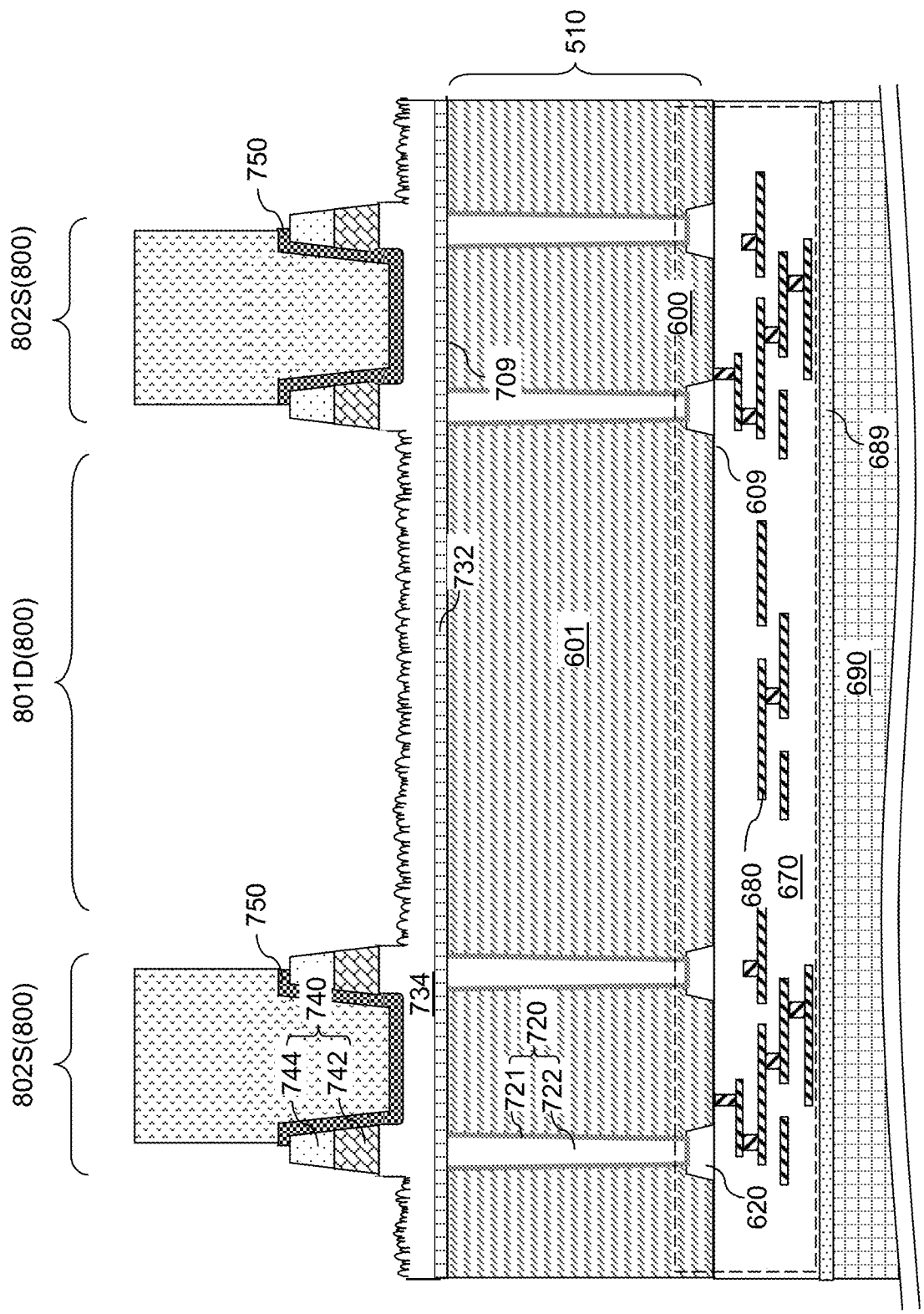
FIG. 12C is a vertical cross-sectional view of the exemplary structure along the vertical plane C-C' of FIG. 12B.

Referring to FIGS. 12A-12C, the masking material layer 750L may be anisotropically etched by performing an anisotropic etch process, such as a reactive ion etch process. The chemistry of the anisotropic etch process may be selected such that the anisotropic etch process induces random variations in the etch rate across the masking material layer 750L. The cause of the random variations in the etch rate may include, but are not limited to, the grain structure in the masking material layer 750L, local variations in the material composition, high susceptibility of the etch rate to local plasma conditions, propensity for pitting during the etching process, susceptibility of the plasma to local charge accumulation, or combinations thereof. Different regions of the optical refraction layer 734 may be physically exposed at different times during the anisotropic etch process due to the etch rate variations across the masking material layer 750L.

The chemistry of the anisotropic etch process may be selected such that the anisotropic etch process collaterally etches the material of the optical refraction layer 734, and forms non-planar distal surface portions 734N including random protrusions 734R on physically exposed portions of the optical refraction layer 734. Generally, non-planar distal surface portions 734N may be formed on the optical refraction layer 734 by anisotropically etching the masking material layer 750L and collaterally etching top portions of the optical refraction layer 734 at a terminal step of the anisotropic etch process.

While an inset in FIG. 12A illustrates one type of vertical cross-sectional profile for random protrusions 734R in the non-planar distal surface portions 734N of the optical refraction layer 734, embodiments are expressly contemplated herein in which the random protrusions 734R have different vertical cross-sectional profiles. Generally, variations in the vertical cross-sectional profile in the random protrusions 734R may be achieved by selecting the material of within the masking material layer 750L and the etch chemistry used to etch the masking material layer 750L and the optical refraction layer 734.

In one embodiment, trenches having different depths may be formed in the optical refraction layer 734 by etching physically exposed portions of the optical refraction layer 734 at a higher etch rate than the material of the masking material layer 750L. In other words, material portions of the optical refraction layer 734 that are physically exposed prior to termination of the anisotropic etch process may be etched at a higher etch rate than a material of the masking material layer 750L during the anisotropic etch process.

In one embodiment, the random protrusions 734R may have a mean lateral dimension in a range from 10 nm to 200 nm. A mean lateral dimension refers to a diameter of an equivalent circle having a same area as a random protrusion 734R. In one embodiment, the random protrusions have a mean vertical dimension in a range from 10 nm to 100 nm. A mean vertical dimension refers to a height of a cylindrical shape having a same horizontal cross-sectional shape as a random protrusion 734R and having a same volume as the random protrusion 734R.

Generally, the optical refraction layer 734 may be located on the backside of the semiconductor substrate 510. The optical refraction layer 734 has a first refractive index, and includes planar distal surface portions and non-planar distal surface portions 734N including random protrusions 734R. The planar distal surface portions are surface portions that contact the bottom surface of the grid structure 740, and may have the same areas as the bottom surface of the grid structure 740. In one embodiment, each of the non-planar distal surface portions 734N may have an areal overlap with a respective one of the photosensors 630 in a plan view, i.e., in a view along a direction that is perpendicular to the backside surface 709 of the semiconductor substrate 510.

Unetched portions of the masking material layer 750L may constitute an array of masking structures 750 after the anisotropic etch process. In one embodiment, the array of masking structures 750 may be located outside areas of the non-planar distal surface portions 734N of the optical refraction layer 734. The array of masking structures 750 may have sidewalls that overlie, and contact, a respective portion of a top surface of the grid structure 740. In one embodiment, each masking structure 750 within the array of masking structures 750 may be located over, and may have an areal overlap in a plan view with, a respective one of the sensing circuits (640, 650, 660). In one embodiment, edges of the masking structures 750 may be located on the top surface of the grid structure 740. In one embodiment, the masking structures 750 do not contact or overlie first sidewalls of the grid structure 740 that face toward a respective one of the openings in the grid structure 740, and contact second sidewalls of the grid structure 740 that face away from a most proximal one of the openings in the grid structure 740. Each region surrounded by a contiguous set of second sidewalls of the grid structure 740 may be within a respective one of the sensing circuit regions (801S, 802S, 803S).

Figure 12D:
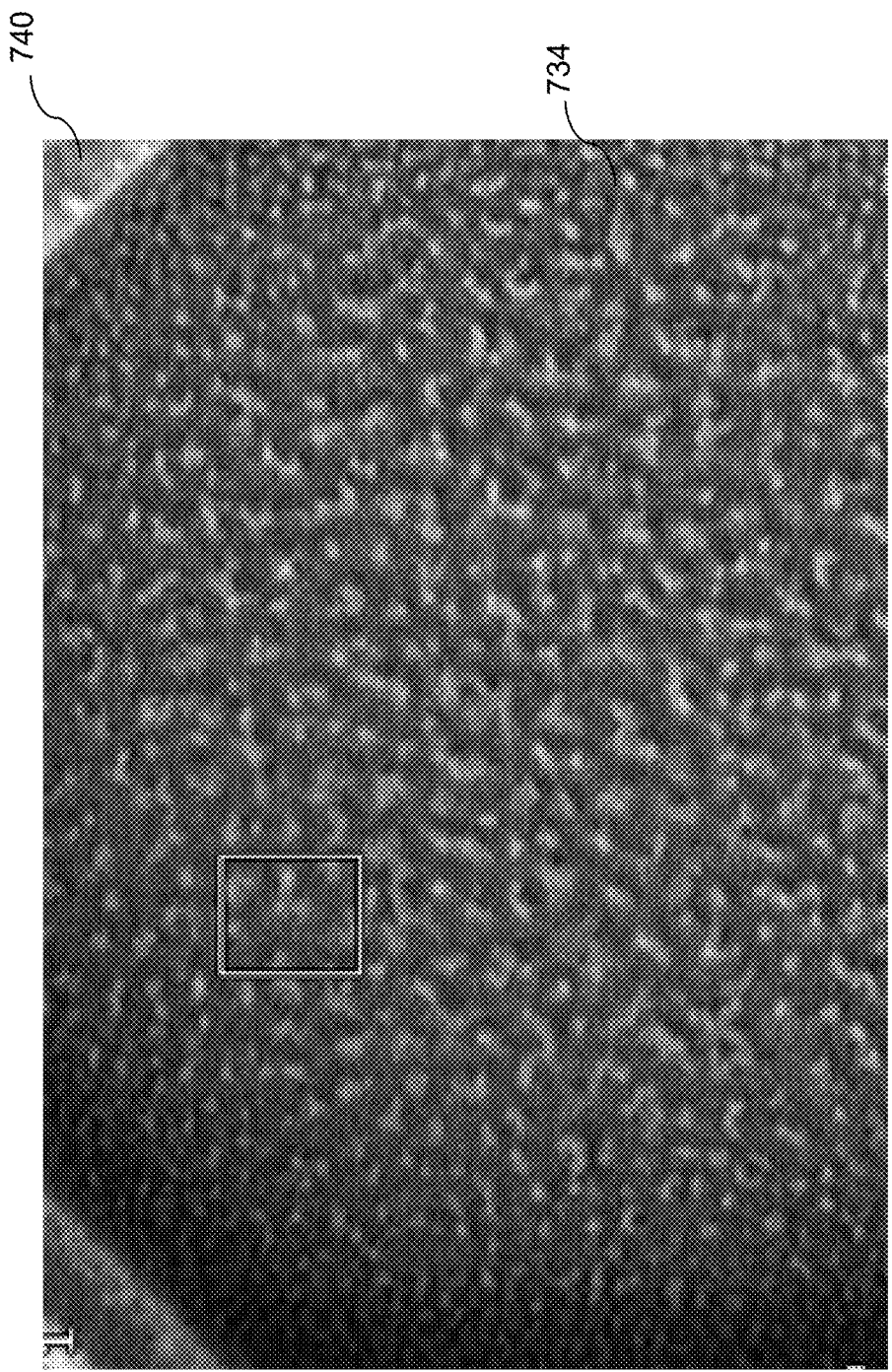
FIG. 12D is a scanning electron micrograph (SEM) of a top surface of an optical refraction layer of a test sample according to an embodiment of the present disclosure.

FIG. 12D shows a scanning electron micrograph (SEM) of a top surface of an optical refraction layer 734 of a test sample after formation of random protrusions 734R. The random protrusions 734R in the optical refraction layer 734 may have random shapes and random size distribution and/or random spacing between neighboring pairs of random protrusions 734R.

Figure 13B:
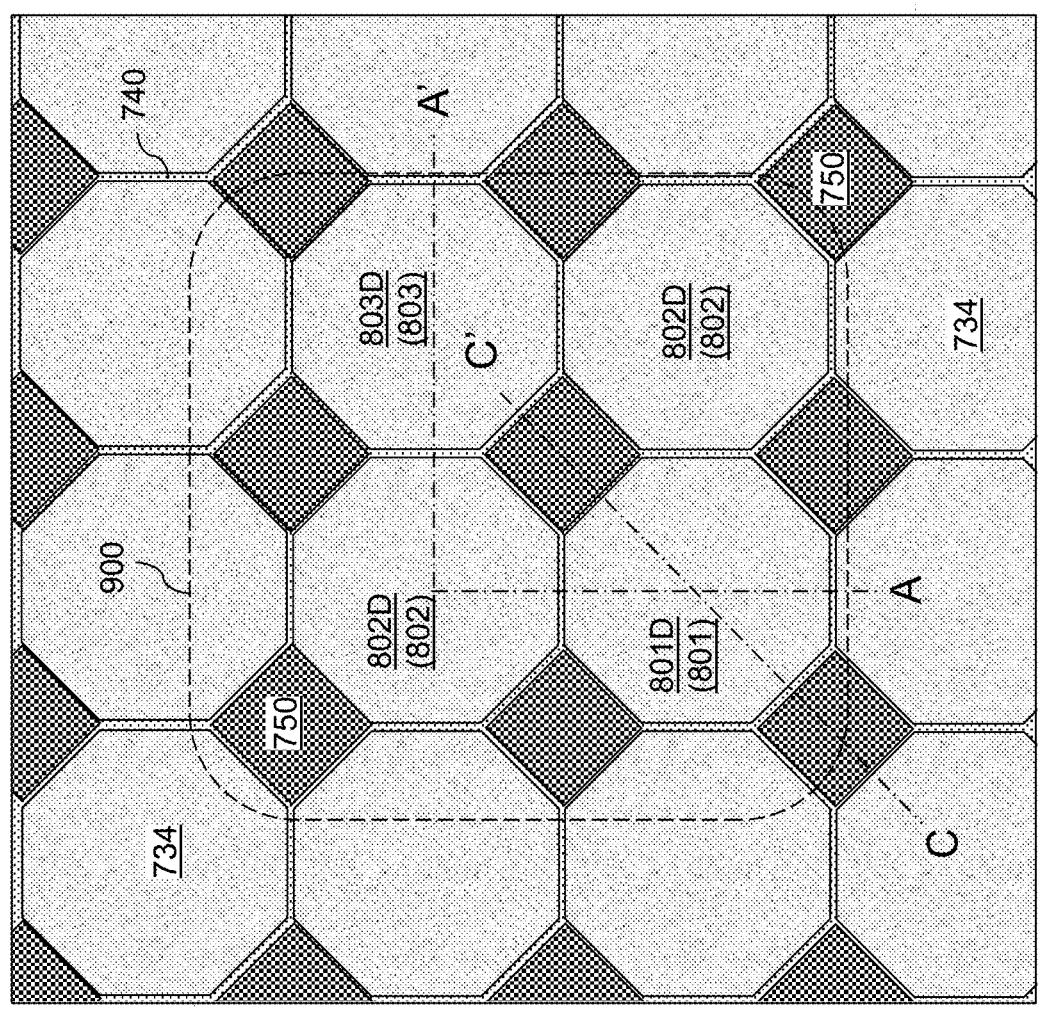
FIG. 13B is a plan view of the exemplary structure of FIG. 13A. The hinged vertical plane A-A' corresponds to the plane of the vertical cross-sectional view of FIG. 13A.
Figure 13C:
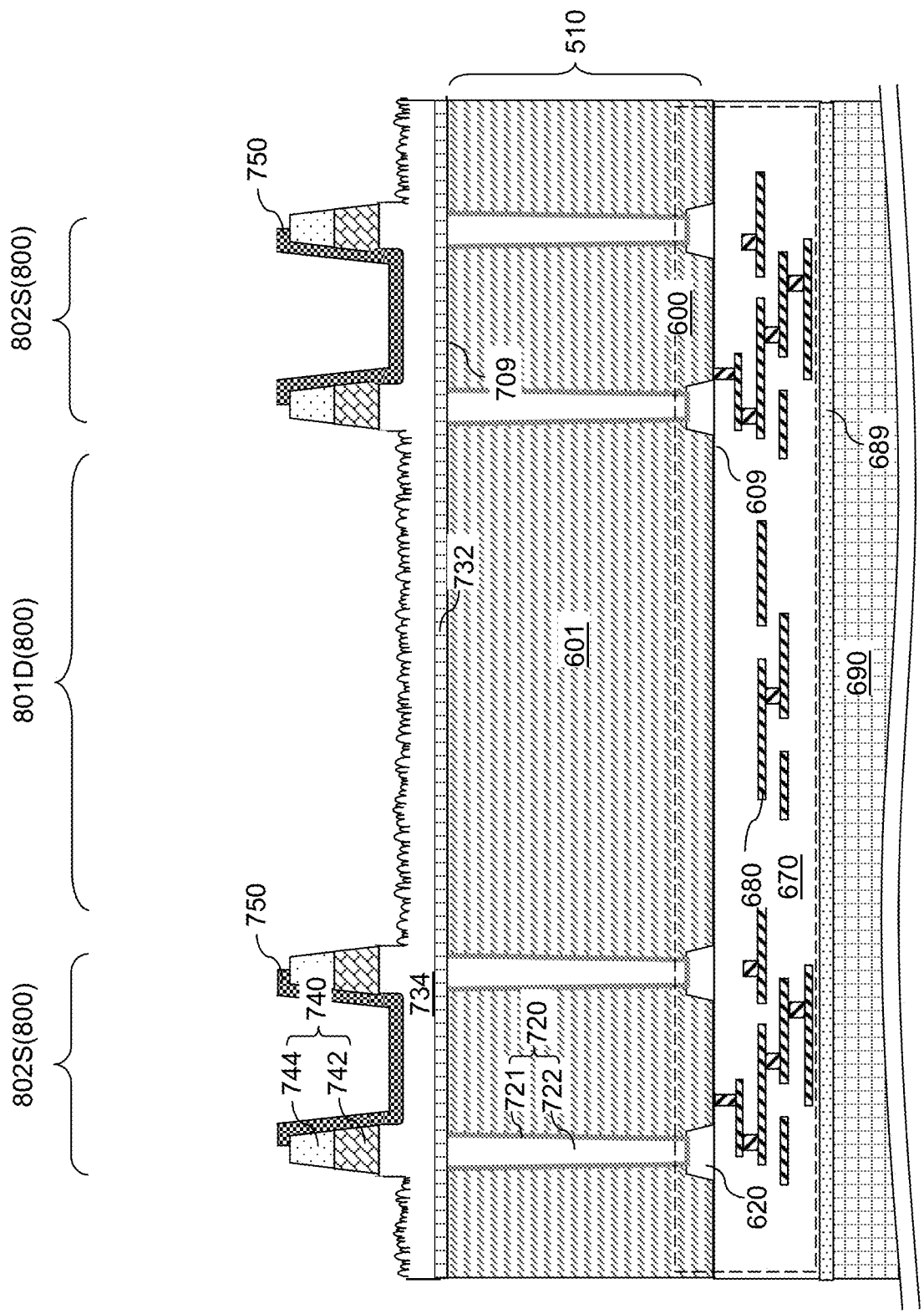
FIG. 13C is a vertical cross-sectional view of the exemplary structure along the vertical plane C-C' of FIG. 13B.

Referring to FIGS. 13A-13C, the exemplary structure is illustrated after removal of the patterned photoresist layer 757. Removal of the patterned photoresist layer 757 may be effected, for example, by ashing.

Figure 14:
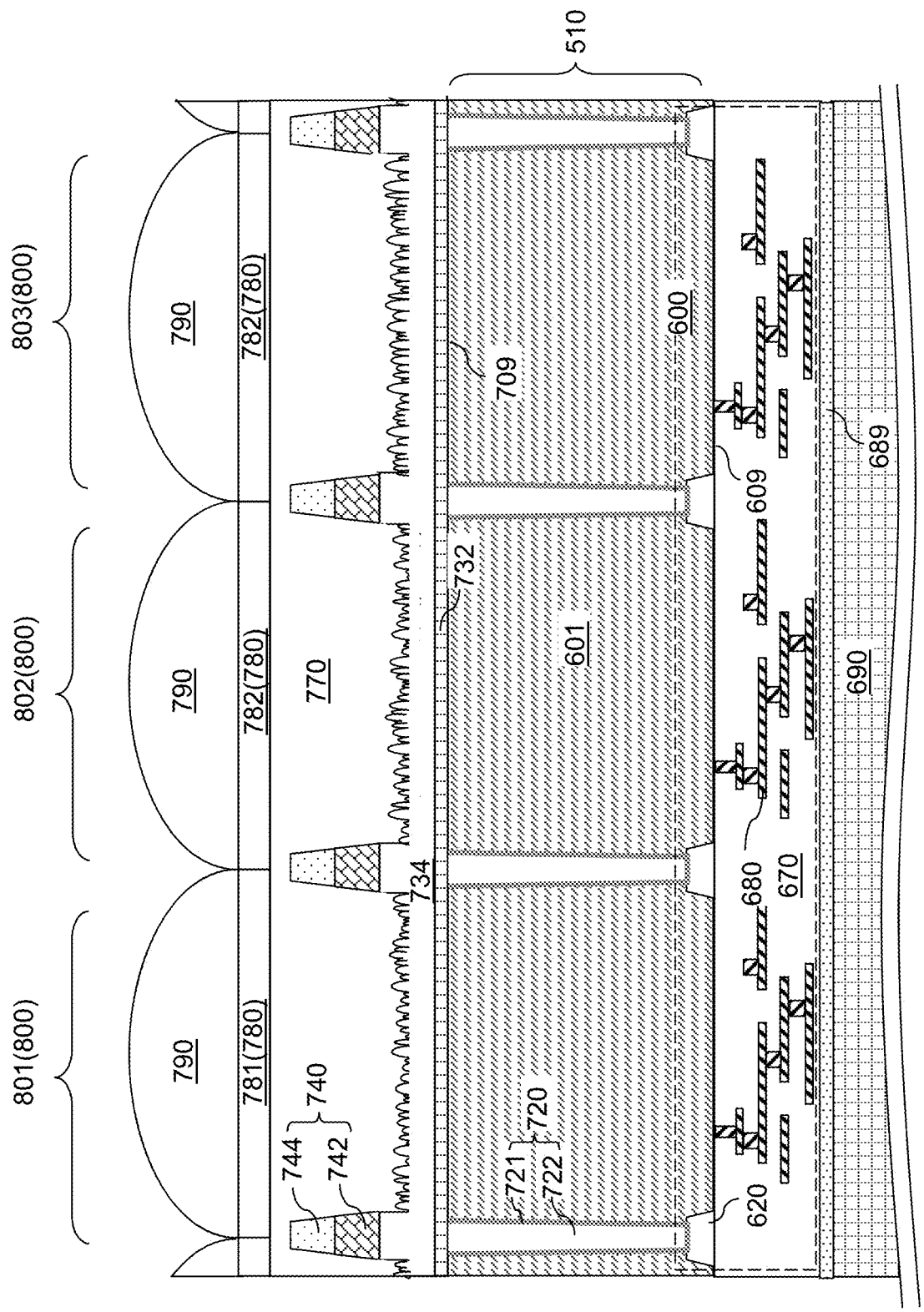
FIG. 14 is a vertical cross-sectional view of the exemplary structure after formation of an optically transparent layer, color filters, and lenses according to an embodiment of the present disclosure.

Referring to FIG. 14, an optically transparent layer 770 having a planar top surface may be formed over the grid structure 740. The optically transparent layer 770 may be formed by depositing a self-planarizing dielectric material such as flowable oxide (FOX). Alternatively, a transparent dielectric material may be deposited and planarized, for example, by chemical mechanical planarization to provide the optically transparent layer 770.

The optically transparent layer 770 vertically extends through the openings in the grid structure 740, and has a second refractive index that is different from the first refractive index. The optically transparent layer 770 may be formed on the non-planar distal surface portions 734N of the optical refraction layer 734. Thus, the non-planar interface between the optically transparent layer 770 and the non-planar distal surface portions 734N of the optical refraction layer 734 provide random refraction of photons that impinge onto the underlying photosensor 630, and may increase the quantum efficiency of the photo sensors 630 in the image sensor.

Various color filtering materials may be applied over the optically transparent layer 770, and may be patterned to form various color filters 780. The color filters 780 may include first-type color filters 781 formed within the regions of the first subpixels 801, second-type color filters 782 formed within the regions of the second subpixels 802, and third-type cooler filters 783 formed within the regions of the third subpixels 803. The composition of each color filtering material may be selected such that light within a target wavelength ranges passes through the color filtering material, while light outside the target wavelength range is absorbed by the color filtering material.

Optical lenses 790 may be formed over the color filters 780 by applying an optically transparent material over the color filters 780 and by patterning the optically transparent material into material portions having convex surfaces that are centered on a respective one of the underlying openings within the grid structure 740.

Figure 15A:
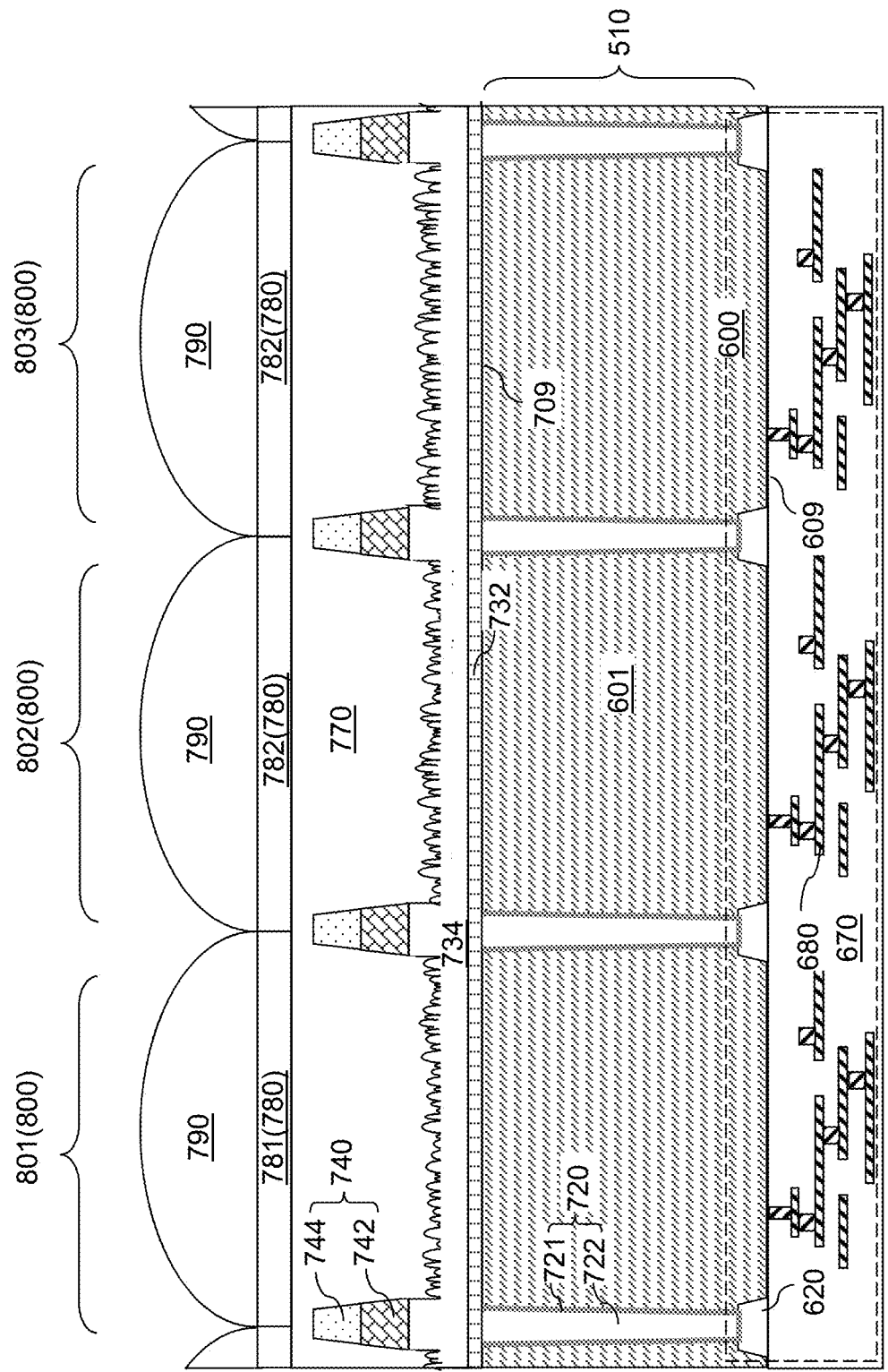
FIG. 15A is a vertical cross-sectional view of the exemplary structure after removal of the carrier substrate according to an embodiment of the present disclosure.
Figure 15B:
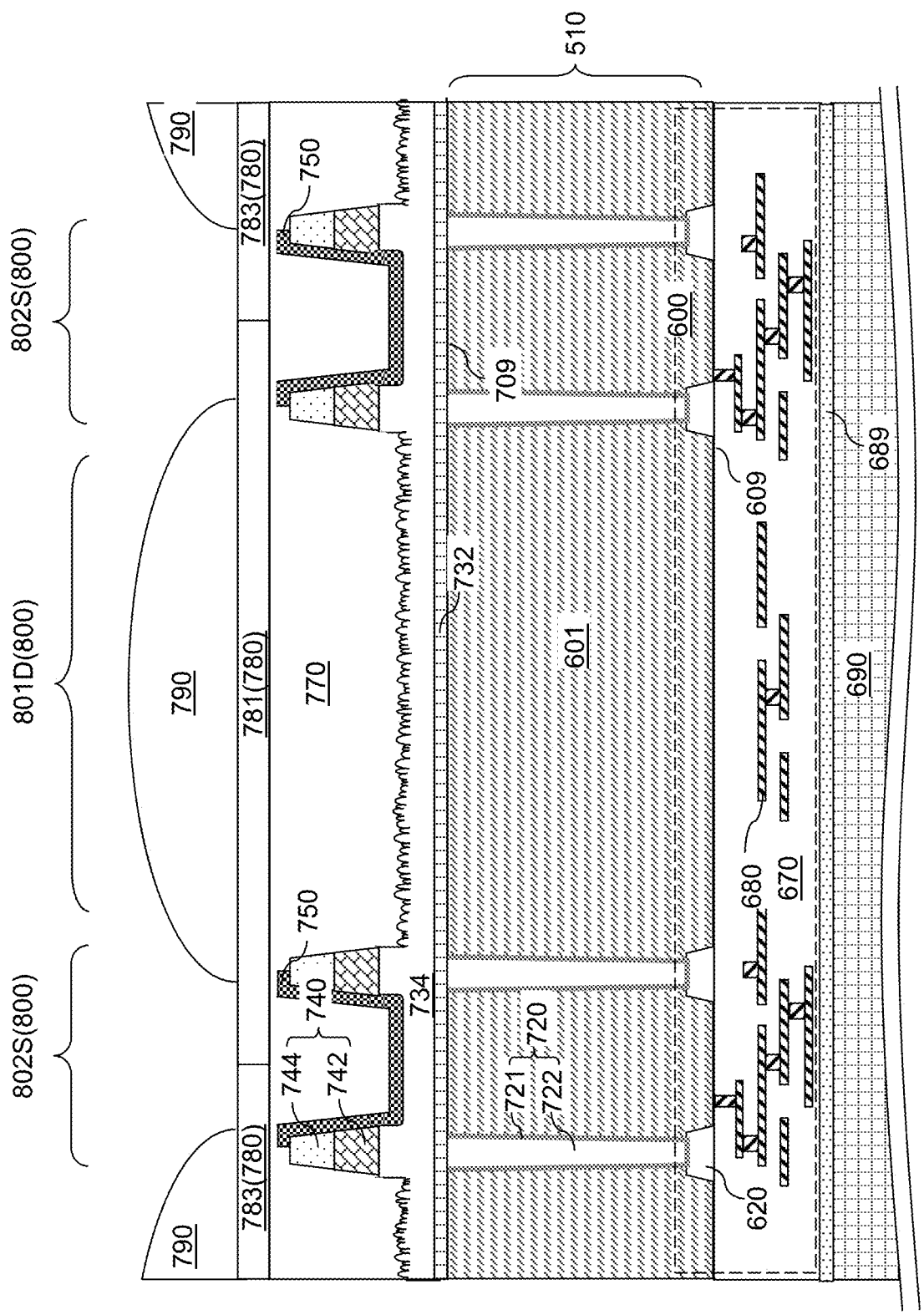
FIG. 15B is another vertical cross-sectional view of the exemplary structure of FIG. 15A.

Referring to FIGS. 15A and 15B, the carrier substrate 690 and the bonding buffer layer 689 (if present) may be detached from the interconnect-level dielectric layers 670. The semiconductor substrate 510 and the device structures thereupon may be singulated into discrete image sensors prior to, or after, detaching the carrier substrate 690 from the semiconductor substrate 510.

Generally, an array 1000 of pixels may be formed on the semiconductor substrate 510. Each pixel within the array 1000 of pixels comprises at least one subpixel, and each subpixel comprise a respective photosensor 630 and a respective sensing circuit (640, 650, 660) located on a front surface 609 of the semiconductor substrate 510. The optically transparent layer 770 may overlie the array of masking structures 750.

Figure 16:
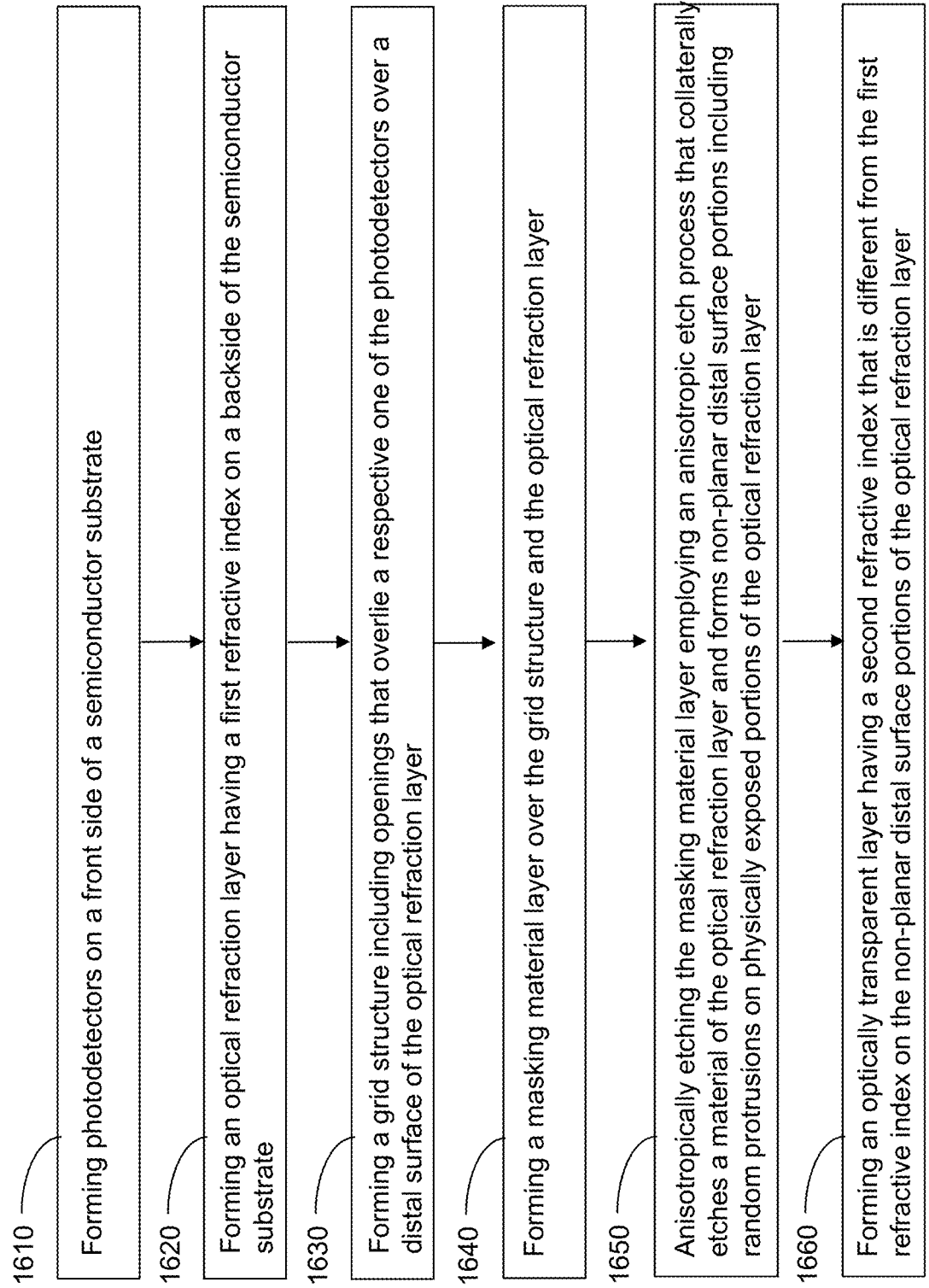
FIG. 16 is a flow chart for an exemplary process sequence for forming an image sensor according to an embodiment of the present disclosure.

Referring to FIG. 16, a general method of forming an image sensor is provided according to an embodiment of the present disclosure. Referring to step 1610, photosensors 630 may be formed on a front side of a semiconductor substrate 500. Referring to step 1620, an optical refraction layer 734 having a first refractive index may be formed on a backside of the semiconductor substrate 510, which may be thinned after formation of the photosensors 630 and prior to formation of the optical refraction layer 734. Referring to step 1630, a grid structure 740 may be formed over a distal surface of the optical refraction layer 734, which may be a planar horizontal surface (i.e., a top surface) that is distal from the semiconductor substrate 510. The grid structure 740 includes openings that overlie a respective one of the photosensors 630. Referring to step 1640, a masking material layer 750L may be formed over the grid structure 740 and the optical refraction layer 734. Referring to step 1650, the masking material layer 750L may be anisotropically etched using an anisotropic etch process that collaterally etches a material of the optical refraction layer 734 and forms non-planar distal surface portions 734N including random protrusions 734R on physically exposed portions of the optical refraction layer 734. Referring to step 1660, an optically transparent layer 770 having a second refractive index that is different from the first refractive index may be formed on the non-planar distal surface portions 734N of the optical refraction layer 734.

Referring to all drawings and according to various embodiments of the present disclosure, provide an optical structure and method of forming the optical structure that manages the optical refraction layer of a image sensor to extend the photon path of light impinging upon the image sensor. Extension of the photon path may increase light absorption to improve the quantum efficiency of the image sensor.

According to an embodiment of the present disclosure, an optical structure is provided, which comprise front side sensors 600 (may comprise a transfer transistor 630, and may be connected to a sense circuit including additional transistors (640, 650, 660) located on a front side of a semiconductor substrate 510; an optical refraction layer 734 located on a backside of the semiconductor substrate 510, having a first refractive index, and including planar distal surface portions and non-planar distal surface portions 734N including random protrusions 734R; a grid structure 740 located on the planar distal surface portions and including openings that overlie the non-planar distal surface portions 734N; and an optically transparent layer 770 vertically extending through the openings in the grid structure 740 and contacting the non-planar distal surface portions 734N and having a second refractive index that is different from the first refractive index, thereby providing a refractive interface with the non-planar distal surface portions 734N that refracts incident light in random directions.

According to another embodiment of the present disclosure, an image sensor is provided, which comprises: an array 1000 of pixels 900 located on a semiconductor substrate 510, wherein each pixel 900 within the array 1000 of pixels 900 comprises at least one subpixel 800, and each subpixel 800 comprise a respective front side sensors 600 (may comprise a transfer transistor 630, and may be connected to a sense circuit including additional transistors (640, 650, 660) located on a front surface 609 of the semiconductor substrate 510; an optical refraction layer 734 located on a backside of the semiconductor substrate 510, having a first refractive index, and including planar distal surface portions and non-planar distal surface portions 734N including random protrusions 734R, wherein each of the non-planar distal surface portions 734N has an areal overlap with a respective one of the photosensors 630 in a plan view; a grid structure 740 located on the planar distal surface portions and including openings that overlie the non-planar distal surface portions 734N; and an optically transparent layer 770 vertically extending through the openings in the grid structure 740 and having a second refractive index that is different from the first refractive index.

According to another embodiment of the present disclosure, a method of forming an optical structure including the steps of forming photosensors on a front side of a semiconductor substrate 510. The method further including the step of forming an optical refraction layer 734 having a first refractive index on a backside of the semiconductor substrate. The method further including the step of forming a grid structure 740 including openings that overlie a respective one of the photosensors over a distal surface of the optical refraction layer 734. The method further including the step of forming a masking material layer over the grid structure 740 and the optical refraction layer 734. The method further including the step of anisotropically etching the masking material layer 750 using an anisotropic etch process that collaterally etches a material of the optical refraction layer 734 and forms non-planar distal surface portions including random protrusions on physically exposed portions of the optical refraction layer 734 and the step of forming an optically transparent layer 770 having a second refractive index that is different from the first refractive index on the non-planar distal surface portions of the optical refraction layer 734.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor comprising:
   an array of pixels located on a semiconductor substrate, wherein each pixel within the array of pixels comprises at least one subpixel, and each subpixel comprises a respective photosensor and a respective sensing circuit located on a front surface of the semiconductor substrate;
   an optical refraction layer located on a backside of the semiconductor substrate, having a first refractive index, and including planar distal surface portions and non-planar distal surface portions including random protrusions, wherein each of the non-planar distal surface portions has an areal overlap with a respective one of the photosensors in a plan view;
   a grid structure located on the planar distal surface portions and including openings that overlie the non-planar distal surface portions;
   an optically transparent layer vertically extending through the openings in the grid structure and having a second refractive index that is different from the first refractive index; and
   an array of masking structures located outside areas of the non-planar distal surface portions of the optically refractive layer, and having sidewalls that overlie, and contact, a respective portion of a top surface of the grid structure, wherein the optically transparent layer overlies the array of masking structures.

2. The image sensor of claim 1, wherein each masking structure within the array of masking structures is located over, and has an areal overlap in a plan view with, a respective one of the sensing circuits.

3. The image sensor of claim 1, wherein the random protrusions have a mean lateral dimension in a range from 10 nm to 200 nm.

4. The image sensor of claim 1, wherein the random protrusions have a mean vertical dimension in a range from 10 nm to 100 nm.

5. The image sensor of claim 1, wherein the optical refraction layer comprises a semiconductor material or a dielectric material.

6. The image sensor of claim 1, wherein the grid structure comprises a composite grid structure including a vertical stack of a metallic grid structure having reflective sidewalls and a dielectric grid structure.

7. The image sensor of claim 1, further comprising:
an array of color filters overlying the optically transparent layer; and
an array of lenses that overlie the array of color filters.

8. An image sensor comprising:
an array of pixels located on a semiconductor substrate, wherein each pixel within the array of pixels comprises at least one subpixel;
an optical refraction layer located on a backside of the semiconductor substrate, having a first refractive index, and including planar distal surface portions and non-planar distal surface portions including random protrusions;
a grid structure located on the planar distal surface portions and including openings that overlie the non-planar distal surface portions;
an optically transparent layer vertically extending through the openings in the grid structure and having a second refractive index that is different from the first refractive index; and
an array of masking structures located outside areas of the non-planar distal surface portions of the optically refractive layer, and having sidewalls that overlie, and contact, a respective portion of a top surface of the grid structure,
wherein each of the non-planar distal surface portions has an areal overlap with a respective one of the photosensors in a plan view.

9. The image sensor of claim 8, wherein the optically transparent layer overlies the array of masking structures.

10. The image sensor of claim 8, wherein:
each subpixel comprises a respective photosensor and a respective sensing circuit located on a front surface of the semiconductor substrate; and
each masking structure within the array of masking structures is located over, and has an areal overlap in a plan view with, a respective one of the sensing circuits.

11. The image sensor of claim 8, wherein the masking structures do not contact or overlie first sidewalls of the grid structure that face toward a respective one of the openings in the grid structure, and contact second sidewalls of the grid structure that face away from a most proximal one of the openings in the grid structure.

12. The image sensor of claim 8, wherein the grid structure comprises a composite grid structure including a vertical stack of a metallic grid structure having reflective sidewalls and a dielectric grid structure.

13. The image sensor of claim 8, wherein an entirety of the grid structure contacts a first subset of the planar distal surface portions, and the first subset of the planar distal surface portions is more distal from the semiconductor substrate than a most distal point among the non-planar distal surface portions is from the semiconductor substrate.

14. An image sensor comprising:
an array of pixels located on a semiconductor substrate, wherein each pixel within the array of pixels comprises at least one subpixel, and each subpixel comprises a respective photosensor and a respective sensing circuit located on a front surface of the semiconductor substrate;
an optical refraction layer located on a backside of the semiconductor substrate, having a first refractive index, and including planar distal surface portions and non-planar distal surface portions including random protrusions;
a grid structure located on the planar distal surface portions and including openings that overlie the non-planar distal surface portions;
an optically transparent layer vertically extending through the openings in the grid structure and having a second refractive index that is different from the first refractive index; and
an array of masking structures located outside areas of the non-planar distal surface portions of the optically refractive layer, and having sidewalls that overlie, and contact, a respective portion of a top surface of the grid structure, wherein the optically transparent layer overlies the array of masking structures.

15. The image sensor of claim 14, wherein a refractive interface is located between the optically transparent layer and the non-planar distal surface portions and refracts incident light in random directions.

16. The image sensor of claim 14, wherein:
the random protrusions have a mean lateral dimension in a range from 10 nm to 200 nm; and
the random protrusions have a mean vertical dimension in a range from 10 nm to 100 nm.

17. The image sensor of claim 14, wherein the optical refraction layer comprises a semiconductor material or a dielectric material.

18. The image sensor of claim 14, wherein the masking structures do not contact or overlie first sidewalls of the grid structure that face toward a respective one of the openings in the grid structure, and contact second sidewalls of the grid structure that face away from a most proximal one of the openings in the grid structure.

19. The image sensor of claim 14, wherein each masking structure within the array of masking structures is located over, and has an areal overlap in a plan view with, a respective one of the sensing circuits.

20. The image sensor of claim 8, wherein the masking structures do not contact or overlie first sidewalls of the grid structure that face toward a respective one of the openings in the grid structure, and contact second sidewalls of the grid structure that face away from a most proximal one of the openings in the grid structure.

* * * * *